US006867118B2

(12) United States Patent
Noro

(10) Patent No.: US 6,867,118 B2
(45) Date of Patent: Mar. 15, 2005

(54) SEMICONDUCTOR MEMORY AND METHOD FOR FABRICATING THE SAME

(75) Inventor: Fumihiko Noro, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/447,220

(22) Filed: May 29, 2003

(65) Prior Publication Data

US 2003/0222293 A1 Dec. 4, 2003

(30) Foreign Application Priority Data

May 30, 2002 (JP) ......................................... 2002-157062

(51) Int. Cl.[7] ............................................. H01L 21/28
(52) U.S. Cl. ...................... 438/581; 438/583; 438/630; 438/649; 438/651; 438/655; 438/664; 438/682; 438/721; 438/755
(58) Field of Search ................................. 438/581, 583, 438/630, 649, 651, 655, 664, 682, 721, 755

(56) References Cited

U.S. PATENT DOCUMENTS

| 6,225,155 | B1 | * | 5/2001 | Lin et al. ..................... 438/238 |
| 6,333,222 | B1 | * | 12/2001 | Kitazawa et al. ............ 438/241 |
| 6,338,993 | B1 | * | 1/2002 | Lien ............................ 438/238 |
| 6,593,609 | B2 | * | 7/2003 | Shinkawata .................. 257/296 |
| 6,624,019 | B2 | * | 9/2003 | Kim ............................. 438/241 |

FOREIGN PATENT DOCUMENTS

| JP | 2002-217308 | 8/2002 | |
| JP | 2002217308 A | * 8/2002 | ....... H01L/21/8234 |

* cited by examiner

Primary Examiner—David Nelms
Assistant Examiner—Andy Huynh
(74) Attorney, Agent, or Firm—McDermott Will & Emery LLP

(57) ABSTRACT

A semiconductor substrate has a memory region and a logic region isolated by an isolation insulating film. Plural memory transistors are provided in the form of a matrix in the memory region, and a logic transistor is provided in the logic region. Gate electrodes of memory transistors arranged along the word line direction out of the plural memory transistors are formed as a common gate electrode extending along the word line direction, and impurity diffusion layers working as source/drain regions of memory transistors arranged along the bit line direction are formed as a common impurity diffusion layer extending along the bit line direction. An inter-gate insulating film having its top face at a lower level than the gate electrodes is formed on the semiconductor substrate between the gate electrodes of the plural memory transistors. A sidewall insulating film is formed on the side face of a gate electrode of the logic transistor. A silicide layer is formed on the gate electrodes of the memory transistors, the gate electrode of the logic transistor and portions of the top faces, exposed from the sidewall insulating film, of impurity diffusion layers working as source/drain regions of the logic transistor.

11 Claims, 24 Drawing Sheets

SEMICONDUCTOR MEMORY AND METHOD FOR FABRICATING THE SAME

BACKGROUND OF THE INVENTION

The present invention relates to a semiconductor memory including a plurality of memory transistors having a diffusion interconnect layer structure and provided in the form of a matrix in a memory region and a logic transistor provided in a logic region, and a method for fabricating the semiconductor memory.

As an electrically writable nonvolatile memory, a semiconductor memory having a structure in which a diffusion interconnect layer also works as a source or a drain of a memory transistor (which structure is designated as a virtual ground structure) is conventionally known.

Recently, there are demands for further refinement, a higher degree of integration, higher performance and higher reliability of a semiconductor device, and a higher operation speed is required of also a semiconductor memory having the virtual ground structure.

Now, a conventional semiconductor memory including both memory transistors having the virtual ground structure and a logic transistor will be described with reference to FIGS. 19, and 20A through 20C. FIG. 20A is a cross-sectional view taken on line Za—Za of FIG. 19, FIG. 20B is a cross-sectional view taken on line Zb—Zb of FIG. 19 and FIG. 20C is a cross-sectional view taken on line Zc—Zc of FIG. 19.

As shown in FIGS. 19 and 20A through 20C, a first active region 11 corresponding to a memory region and a second active region 12 corresponding to a logic region isolated from each other by an isolation insulating film 13 are formed on a semiconductor substrate 10. A plurality of memory transistors are provided in the form of a matrix in the first active region 11 and a logic transistor is provided in the second active region 12.

In the first active region 11, a gate electrode 15 of each memory transistor is formed with a memory insulating film 14 sandwiched between the gate electrode 15 and the semiconductor substrate 10, and the memory insulating film 14 is composed of a multilayer structure including a lower gate insulating film 14a of a silicon oxide film, a capacitor film 14b of a silicon nitride film and an upper gate insulating film 14c of a silicon oxide film, and a sidewall insulating film 16 is formed on the side face of the gate electrode 15. The respective gate electrodes 15 of some memory transistors arranged along the word line direction out of the plural memory transistors are formed as a common gate electrode extending along the word line direction, so that each common gate electrode 15 can correspond to a word line. On the other hand, impurity diffusion layers 17 working as the source and drain regions of some memory transistors arranged along the bit line direction out of the plural memory transistors are formed as a common impurity diffusion layer extending along the bit line direction, so that each common impurity diffusion layer 17 can correspond to a bit line. The plural memory transistors are covered with a memory region protection insulating film 18. In FIG. 19, however, the memory region protection insulating film 18 is omitted for convenience of the drawing.

In the second active region 12, a gate electrode 22 of the logic transistor is formed with a logic insulating film 21 of a silicon oxide film sandwiched between the gate electrode 22 and the semiconductor substrate 10, and a sidewall insulating film 23 is formed on the side face of the gate electrode 22. Also in the second active region 12, impurity diffusion layers 24 working as the source and drain regions are formed, and a silicide layer 25 is formed on the gate electrode 22 and the impurity diffusion layers 24.

Now, a method for fabricating the conventional semiconductor memory will be described with reference to FIGS. 21A through 21C, 22A through 22C, 23A through 23C and 24A through 24C. FIGS. 21A, 22A, 23A and 24A are cross-sectional views taken on line Za—Za of FIG. 19, FIGS. 21B, 22B, 23B and 24B are cross-sectional views taken on line Zb—Zb of FIGS. 19 and 21C, 22C, 23C and 24C are cross-sectional views taken on line Zc—Zc of FIG. 19.

First, as shown in FIGS. 21A through 21C, an isolation insulating film 13 of a silicon oxide film is formed in a surface portion of a semiconductor substrate 10, so as to form a first active region 11 corresponding to a memory region and a second active region 12 corresponding to a logic region. Thereafter, impurity ions such as arsenic ions are implanted into predetermined portions of the first active region 11 and annealing is then carried out, so as to form impurity diffusion layers 17 working as the source and drain regions of memory transistors and extending along the bit line direction.

Next, as shown in FIGS. 22A through 22C, in the first active region 11 and the second active region 12, a lower silicon oxide film is formed through thermal oxidation, and thereafter, an intermediate silicon nitride film and an upper silicon oxide film are deposited by low pressure CVD in the first active region 11. Then, a polysilicon film is deposited by the low pressure CVD in the first active region 11 and the second active region 12. Subsequently, the polysilicon film, the upper silicon oxide film, the intermediate silicon nitride film and the lower silicon oxide film are patterned in the first active region 11, so as to form a gate electrode 15 of each memory transistor from the polysilicon film, an upper gate insulating film 14c from the upper silicon oxide film, a capacitor film 14b from the intermediate silicon nitride film and a lower gate insulating film 14a from the lower silicon oxide film. In this manner, a memory gate insulating film 14 composed of a multilayer structure including the upper gate insulating film 14c, the capacitor film 14b and the lower gate insulating film 14a is formed below the gate electrode 15 of each memory transistor. On the other hand, in the second active region 12, the polysilicon film and the lower silicon oxide film are patterned, so as to form a gate electrode 22 of a logic transistor from the polysilicon film and a logic gate insulating film 21 from the lower silicon oxide film.

Next, in the first active region 11 and the second active region 12, a silicon oxide film is deposited by the low pressure CVD and the silicon oxide film is etched back, so as to form a sidewall insulating film 16 on the side face of the gate electrode 14 of each memory transistor and a sidewall insulating film 23 on the side face of the gate electrode 22 of the logic transistor. Then, in the second active region 12, impurity ions such as arsenic ions are implanted by using the gate electrode 22 and the sidewall insulating film 23 of the logic transistor as a mask and annealing is then carried out, so as to form impurity diffusion layers 24 working as source and drain regions.

Subsequently, as shown in FIGS. 23A through 23C, in the first active region 11 and the second active region 12, a silicon oxide film is deposited by the low pressure CVD, and a resist pattern 26 having an opening in the second active region 12 is formed on the silicon oxide film. Thereafter, the silicon oxide film is etched by using the resist pattern 26 as a mask, so as to form a memory region protection insulating film 18 for covering the first active region 11.

Then, as shown in FIGS. 24A through 24C, the resist pattern 26 is removed, and a silicide layer 25 is formed on the gate electrode 22 and the impurity diffusion layers 24 of the logic transistor by salicide technique. Thus, the conventional semiconductor memory is completed.

Although procedures for forming metal interconnects, forming a protection film and forming bonding pads are carried out thereafter, these procedures are not described herein because they are known.

Since the operation speed of a semiconductor memory is required to be increased, a silicide layer is desired to be formed on the gate electrode 15 of each memory transistor.

In order to form a suicide layer on the gate electrode 15 of the memory transistor, it is necessary to practice the salicide technique without forming the memory region protection insulating film 18 in the first active region 11. However, when the salicide technique is thus practiced, the silicide layer is unavoidably formed on the impurity diffusion layers 17 of the memory transistors, which causes a problem that the source and drain regions of a plurality of memory transistors arranged along the bit line direction are short-circuited.

SUMMARY OF THE INVENTION

In consideration of the above-described conventional problem, an object of the invention is forming a silicide layer on a gate electrode of a memory transistor without forming the silicide layer on impurity diffusion layers of the memory transistor.

In order to achieve the object, the semiconductor memory of this invention includes a semiconductor substrate having a memory region and a logic region isolated from each other by an isolation insulating film; a plurality of memory transistors provided in the form of a matrix in the memory region of the semiconductor substrate; and a logic transistor provided in the logic region of the semiconductor substrate, and gate electrodes of some memory transistors arranged along a word line direction out of the plurality of memory transistors are formed as a common gate electrode extending in the word line direction, impurity diffusion layers working as source and drain regions of some memory transistors arranged along a bit line direction out of the plurality of memory transistors are formed as a common impurity diffusion layer extending in the bit line direction, an inter-gate insulating film having a top face at a level lower than a top face of the gate electrodes is formed on the semiconductor substrate between adjacent gate electrodes of the plurality of memory transistors, a sidewall insulating film is formed on a side face of a gate electrode of the logic transistor, and a silicide layer is formed on the gate electrodes of the plurality of memory transistors, on the gate electrode of the logic transistor and on portions, exposed from the sidewall insulating film, of top faces of impurity diffusion layers working as source and drain regions of the logic transistor.

In the semiconductor memory of this invention, the inter-gate insulating film having the top face at a level lower than the top face of the gate electrodes is formed on the semiconductor substrate between the adjacent gate electrodes of the plural memory transistors. Therefore, in forming the silicide layer on the gate electrodes of the memory transistors, the surfaces of the impurity diffusion layers of the memory transistors are not silicided, so that the impurity diffusion layers of the memory transistors adjacent to each other along the bit line direction can be prevented from being short-circuited. Accordingly, while preventing the short-circuit between the source or drain regions of the plural memory transistors arranged along the bit line direction, the silicide layer can be formed on the gate electrodes of the memory transistors, so as to realize a high speed operation of the memory transistors.

In the semiconductor memory of this invention, a memory gate insulating film formed below the gate electrode of each of the plurality of memory transistors preferably includes a capacitor film.

Thus, a memory device for trapping charge in the memory gate insulating film can be realized.

In the semiconductor memory of this invention, the memory gate insulating film is preferably composed of a multilayer structure including a lower silicon oxide film and an upper silicon nitride film, and the capacitor film preferably corresponds to the upper silicon nitride film.

Thus, a memory device for trapping charge in the memory gate insulating film can be definitely realized.

In the semiconductor memory of this invention, the memory gate insulating film is preferably composed of a multilayer structure including a lower silicon oxide film, an intermediate silicon nitride film and an upper silicon oxide film, and the capacitor film preferably corresponds to the intermediate silicon nitride film.

Thus, a memory device for trapping charge in the memory gate insulating film can be definitely realized.

In the semiconductor memory of this invention, a memory gate insulating film formed below the gate electrode of each of the plurality of memory transistors is preferably composed of a multilayer structure including a lower silicon oxide film, an intermediate silicon nitride film and an upper silicon oxide film, and the intermediate silicon nitride film is preferably formed as a common silicon nitride film for connecting respective memory gate insulating films of the plurality of memory transistors to one another.

Thus, even when etching is excessively performed in forming the inter-gate insulating film, the silicide layer can be definitely prevented from being formed on an exposed portion on the top face of the impurity diffusion layer of the memory transistor.

In the semiconductor memory of this invention, a source region of one of a pair of memory transistors adjacent to each other along the bit line direction out of the plurality of memory transistors and a drain region of another of the adjacent memory transistors are preferably formed as a common impurity diffusion layer.

Thus, the area of each memory transistor can be reduced.

The first method of this invention for fabricating a semiconductor memory including a semiconductor substrate having a memory region and a logic region isolated from each other by an isolation insulating film, a plurality of memory transistors provided in the form of a matrix in the memory region of the semiconductor substrate and a logic transistor provided in the logic region, includes the steps of forming, in the memory region, impurity diffusion layers working as source and drain regions of some memory transistors arranged along a bit line direction out of the plurality of memory transistors as a common impurity diffusion layer extending along the bit line direction; forming a memory gate insulating film in the memory region and a logic gate insulating film in the logic region; depositing a silicon-containing film on the memory gate insulating film and the logic gate insulating film; patterning the silicon-containing film in the memory region, whereby forming gate electrodes of some memory transistors arranged along a word line direction out of the plurality of memory transistors as a common gate electrode extending along the word line direction, and patterning the silicon-containing film in the logic region, whereby forming a gate electrode of the logic transistor; forming a sidewall insulating film on a side face of the gate electrode of the logic transistor; forming, in the logic region, impurity diffusion layers working as source and drain regions of the logic transistor; forming a first insulating film in the memory region and the logic region and forming a second insulating film on the first insulating film from a different material from the first insulating film; successively etching the second insulating film and the first insulating film in the memory region, whereby exposing top faces of the gate electrodes of the plurality of memory transistors and whereby forming, from the first insulating film, an inter-gate insulating film having a top face at a level lower than a top face of the gate electrodes between adjacent gate electrodes of the plurality of memory transistors; successively etching the second insulating film and the first insulating film in the logic region, whereby exposing top faces of the gate electrode and the impurity diffusion layers of the logic transistor; and forming a silicide layer on the gate electrodes of the plurality of memory transistors, on the gate electrode of the logic transistor and on portions of top faces, exposed from the sidewall insulating film, of the impurity diffusion layers of the logic transistor.

In the first method for fabricating a semiconductor memory, the silicide layer is formed on the gate electrodes of the memory transistors after forming, from the first insulating film, the inter-gate insulating film having the top face at a level lower than the top face of the gate electrodes between the adjacent gate electrodes of the plural memory transistors. Therefore, in forming the silicide layer on the gate electrodes of the memory transistors, the surfaces of the impurity diffusion layers of the memory transistors are not silicided, so that the impurity diffusion layers of the memory transistors adjacent to each other along the bit line direction can be prevented from being short-circuited. Accordingly, while preventing the short-circuit between the source or drain regions of the plural memory transistors arranged along the bit line direction, the silicide layer can be formed on the gate electrodes of the memory transistors, so as to realize a high speed operation of the memory transistors.

In the first method for fabricating a semiconductor memory of this invention, the memory gate insulating film preferably includes a capacitor film.

Thus, a memory device for trapping charge in the memory gate insulating film can be realized.

In the first method for fabricating a semiconductor memory of this invention, the memory gate insulating film is preferably composed of a multilayer structure including a lower silicon oxide film and an upper silicon nitride film, and the capacitor film preferably corresponds to the upper silicon nitride film.

Thus, a memory device for trapping charge in the memory gate insulating film can be definitely realized.

In the first method for fabricating a semiconductor memory of this invention, the memory gate insulating film is preferably composed of a multilayer structure including a lower silicon oxide film, an intermediate silicon nitride film and an upper silicon oxide film, and the capacitor film preferably corresponds to the intermediate silicon nitride film.

Thus, a memory device for trapping charge in the memory gate insulating film can be definitely realized.

The second method of this invention for fabricating a semiconductor memory including a semiconductor substrate having a memory region and a logic region isolated from each other by an isolation insulating film, a plurality of memory transistors provided in the form of a matrix in the memory region and a logic transistor provided in the logic region, includes the steps of forming, in the memory region, impurity diffusion layers working as source and drain regions of some memory transistors arranged along a bit line direction out of the plurality of memory transistors as a common impurity diffusion layer extending along the bit line direction; forming a memory gate insulating film in the memory region and a logic gate insulating film in the logic region; depositing a silicon-containing film on the memory gate insulating film and the logic gate insulating film; patterning the silicon-containing film, whereby forming gate electrodes of some memory transistors arranged along a word line direction out of the plurality of memory transistors as a common gate electrode extending along the word line direction in the memory region, and whereby forming a gate electrode of the logic transistor in the logic region; forming a first insulating film in the memory region and the logic region, and forming a second insulating film on the first insulating film from a different material from the first insulating film; successively etching the second insulating film and the first insulating film in the memory region, whereby exposing top faces of the gate electrodes of the plurality of memory transistors and forming, from the first insulating film, an inter-gate insulating film having a top face at a level lower than top faces of gate electrodes between adjacent gate electrodes of the plurality of memory transistors; successively etching the second insulating film and the first insulating film in the logic region, whereby exposing top faces of the gate electrode and the impurity diffusion layers of the logic transistor and forming, from the first insulating film, a sidewall insulating film on a side face of the gate electrode of the logic transistor; forming impurity diffusion layers working as source and drain regions of the logic transistor in the logic region; and forming a silicide layer on the gate electrodes of the plurality of memory transistors, on the gate electrode of the logic transistor and on portions of top faces, exposed from the sidewall insulating film, of the impurity diffusion layers of the logic transistor.

In the second method for fabricating a semiconductor memory, the silicide layer is formed on the gate electrodes of the memory transistors after forming, from the first insulating film, the inter-gate insulating film having the top face at a level lower than the top face of the gate electrodes between the gate electrodes of the plural memory transistors. Therefore, in forming the silicide layer on the gate electrodes of the memory transistors, the surfaces of the impurity diffusion layers of the memory transistors are not silicided, so that the impurity diffusion layers of the memory transistors adjacent to each other along the bit line direction can be prevented from being short-circuited. Accordingly, while preventing the short-circuit between the source or drain regions of the plural memory transistors arranged along the bit line direction, the silicide layer can be formed on the gate electrodes of the memory transistors, so as to realize a high speed operation of the memory transistors.

Also, since the second method includes the step of forming the sidewall insulating film from the first insulating film on the side face of the gate electrode of the logic transistor, the number of procedures required for forming the sidewall insulating film can be reduced.

In the second method for fabricating a semiconductor memory of this invention, the memory gate insulating film is preferably composed of a multilayer structure including a lower silicon oxide film, an intermediate silicon nitride film and an upper silicon oxide film, and the step of forming a memory gate insulating film preferably includes a sub-step of allowing the intermediate silicon nitride film to remain without being patterned.

Thus, even when the etching is excessively performed in forming the inter-gate insulating film by successively etching the second insulating film and the first insulating film, the silicide layer can be prevented from being formed on an exposed portion on the top faces of the impurity diffusion layers of the memory transistors.

In the first or second method for fabricating a semiconductor memory of this invention, the silicon-containing film is preferably patterned simultaneously in the memory region and the logic region.

Thus, there is no need to provide an excessive margin in forming upper layer contacts above the gate electrodes of the memory transistors and the gate electrode of the logic transistor, and therefore, the semiconductor memory can be refined.

In the first or second method for fabricating a semiconductor memory of this invention, a source region of one of a pair of memory transistors adjacent to each other along the bit line direction out of the plurality of memory transistors and a drain region of another of the adjacent memory transistors are preferably formed as a common impurity diffusion layer.

Thus, the area of each memory transistor can be reduced.

DETAILED DESCRIPTION OF THE INVENTION

Embodiment 1

Figure 1:
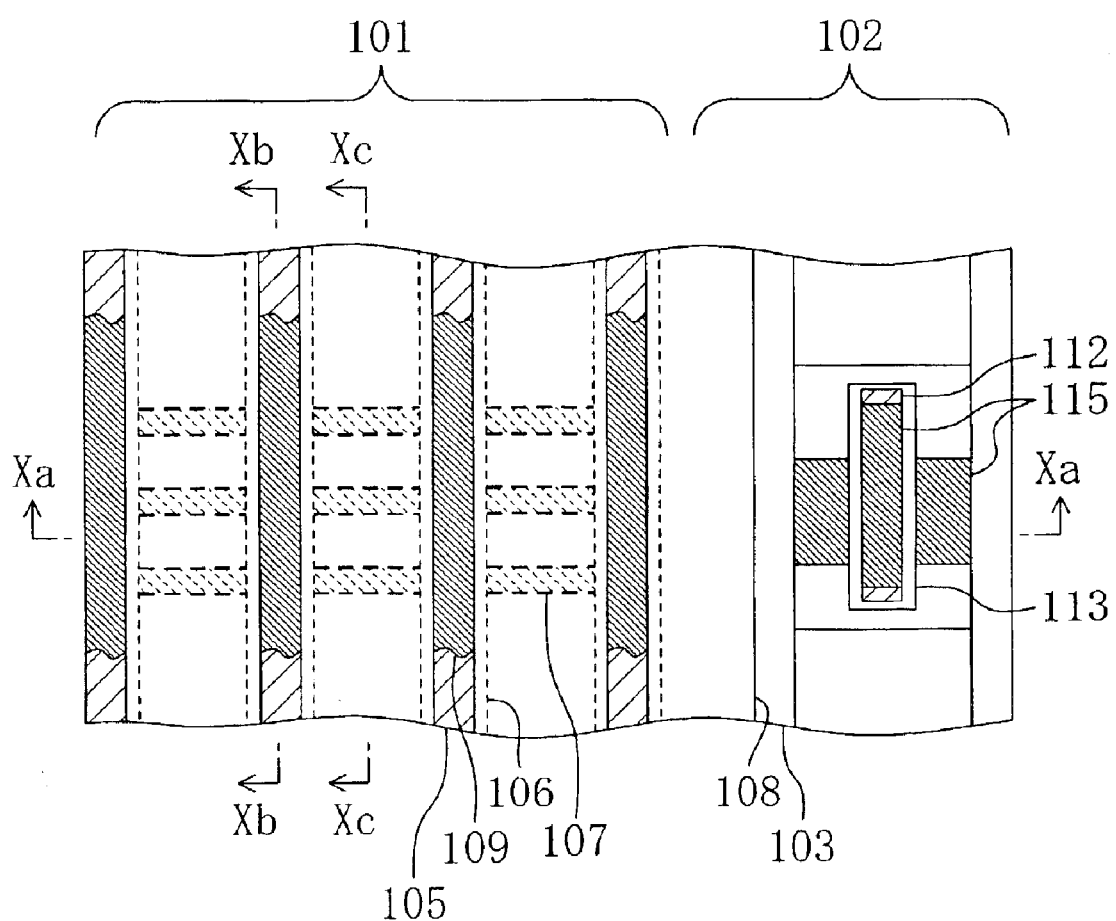
FIG. 1 is a plan view of a semiconductor memory according to Embodiment 1 of the invention.
Figure 2A:
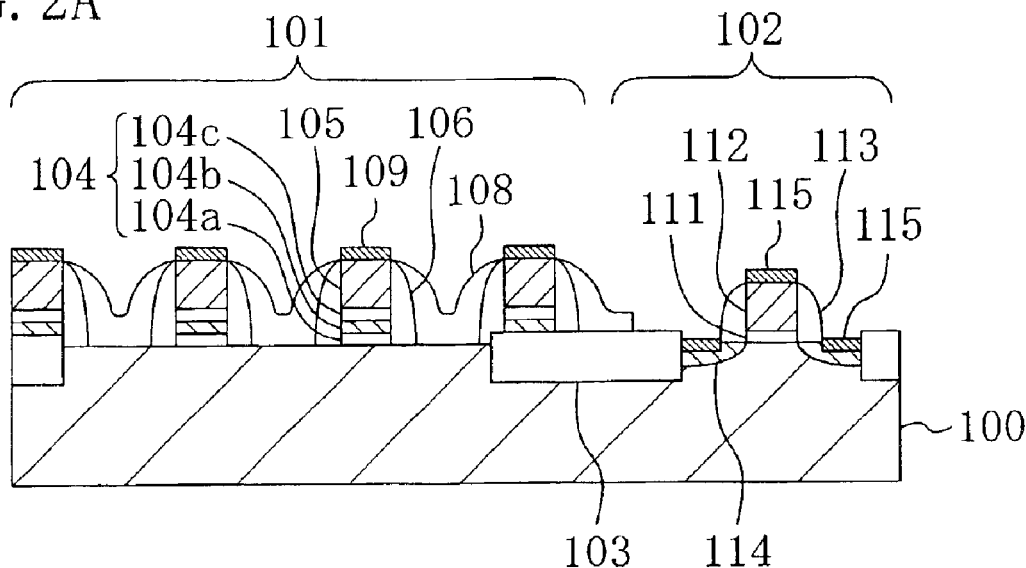
FIG. 2A is a cross-sectional view taken on line Xa—Xa of FIG. 1.
Figure 2B:
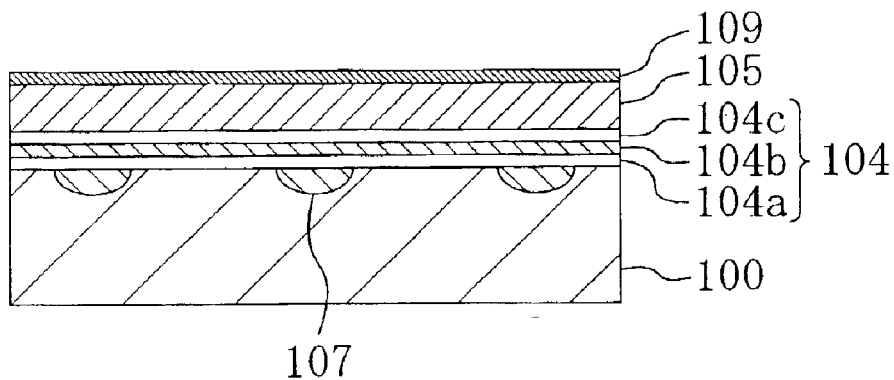
FIG. 2B is a cross-sectional view taken on line Xb—Xb of FIG. 1
Figure 2C:
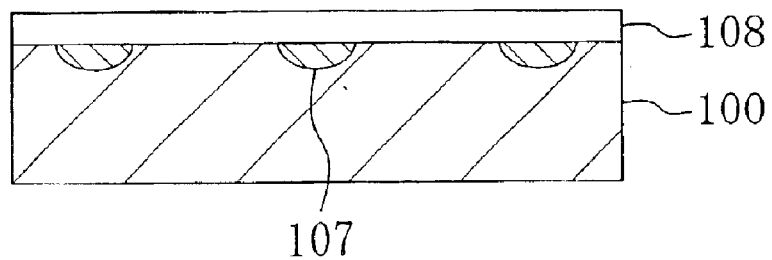
FIG. 2C is a cross-sectional view taken on line Xc—Xc of FIG. 1.

A semiconductor memory according to Embodiment 1 of the invention will now be described with reference to FIGS. 1 and 2A through 2C. FIG. 2A is a cross-sectional view taken on line Xa—Xa of FIG. 1, FIG. 2B is a cross-sectional view taken on line Xb—Xb of FIG. 1 and FIG. 2C is a cross-sectional view taken on line Xc—Xc of FIG. 1.

As shown in FIGS. 1 and 2A through 2C, a first active region 101 corresponding to a memory region and a second active region 102 corresponding to a logic region that are isolated from each other by an isolation insulating film 103 are formed on a semiconductor substrate 100. A plurality of memory transistors are provided in the form of a matrix in the first active region 101 and a logic transistor is provided in the second active region 102.

In the first active region 101, a memory gate electrode 105 is formed with a memory insulating film 104 sandwiched between the memory gate electrode 105 and the semiconductor substrate 100, and the memory insulating film 104 is composed of a multilayer structure including a lower gate insulating film 104a of a silicon oxide film, a capacitor film 104b of a silicon nitride film and an upper gate insulating film 104c of a silicon oxide film. A sidewall insulating film 106 is formed on the side faces of the memory insulating film 104 and the memory gate electrode 105. Some memory gate electrodes 105 arranged along the word line direction are formed as a common memory gate electrode extending along the word line direction, so that each common memory gate electrode 105 can correspond to a word line. A silicide layer 109 is formed on the memory gate electrode 105.

In the first active region 101, impurity diffusion layers 107 are formed so as to extend along the bit line direction, and the impurity diffusion layers 107 work as source or drain regions of some memory transistors arranged along the bit line direction and correspond to bit lines.

The memory insulating film 104, the memory gate electrode 105, the silicide layer 109 and the impurity diffusion layers 107 described above together form a memory transistor.

An inter-gate insulating film 108 having its top face at a level lower than the top face of the gate electrodes 105 is formed between the adjacent memory gate electrodes 105.

In the second active region 102, a logic gate electrode 112 is formed with a logic insulating film 111 of a silicon oxide film sandwiched between the logic gate electrode 112 and the semiconductor substrate 100, and a sidewall insulating film 113 is formed on the side faces of the logic insulating film 111 and the logic gate electrode 112. Also, in the second active region 102, impurity diffusion layers 114 working as source and drain regions are formed, and a silicide layer 115 is formed on the logic gate electrode 112 and the impurity diffusion layers 114.

The logic insulating film 111, the logic gate electrode 112 and the impurity diffusion layers 114 described above together form a logic transistor.

Now, a method for fabricating the semiconductor memory according to Embodiment 1 will be described with reference to FIGS. 3A through 3C, 4A through 4C, 5A through 5C, 6A through 6C, 7A through 7C, 8A through 8C and 9A through 9C. FIGS. 3A, 4A, 5A, 6A, 7A, 8A and 9A are cross-sectional views taken on line Xa—Xa of FIG. 1, FIGS. 3B, 4B, 5B, 6B, 7B, 8B and 9B are cross-sectional views taken on line Xb—Xb of FIG. 1 and FIGS. 3C, 4C, 5C, 6C, 7C, 8C and 9C are cross-sectional views taken on line Xc—Xc of FIG. 1.

Figure 3A:
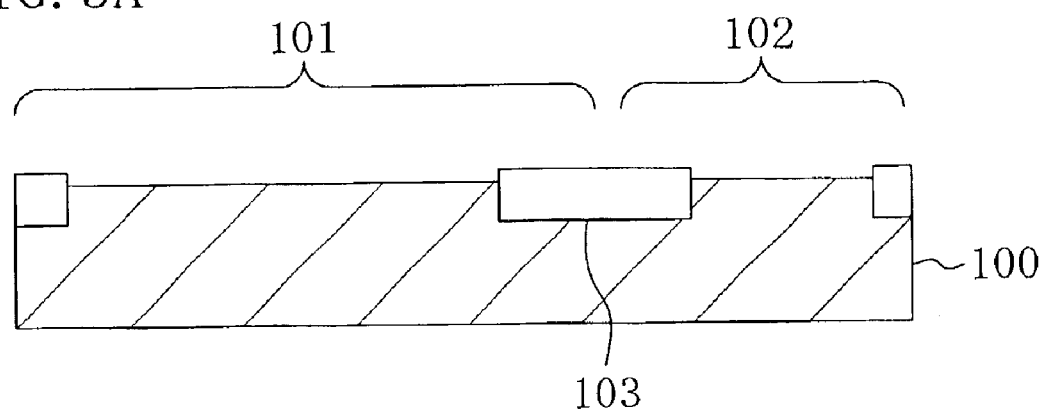
FIGS. 3A, 3B and 3C are cross-sectional views for showing procedures in a method for fabricating a semiconductor memory of Embodiment 1.
Figure 3B:
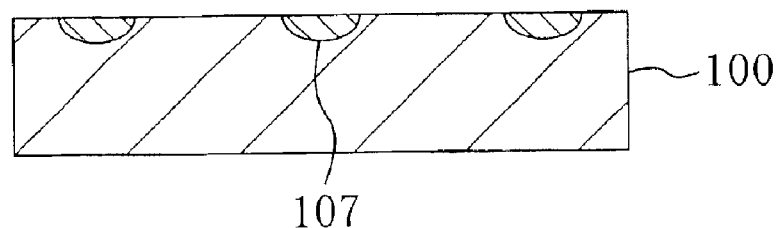
Figure 3C:
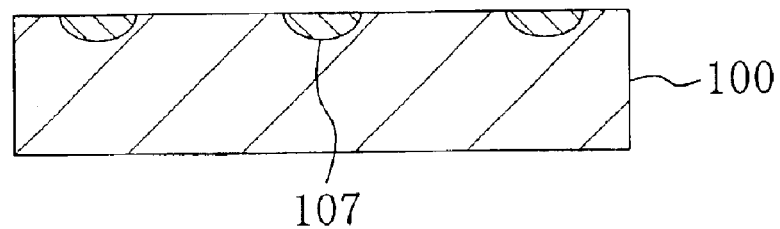

First, as shown in FIGS. 3A through 3C, an isolation insulating film 103 is formed in a surface portion of a semiconductor substrate 100 by filling a silicon oxide film in a groove with a depth of approximately 300 nm, so as to form a first active region 101 corresponding to a memory region and a second active region 102 corresponding to a logic region. Next, impurity ions such as arsenic ions are implanted into predetermined portions of the first active region 101 at an acceleration voltage of 50 keV and a dose of $5 \times 10^{15}/cm^2$, and annealing is then carried out in a nitrogen atmosphere at a temperature of, for example, 900° C. for 60 minutes. Thus, impurity diffusion layers 107 working as source and drain regions of memory transistors are formed so as to extend in the bit line direction.

Figure 4A:
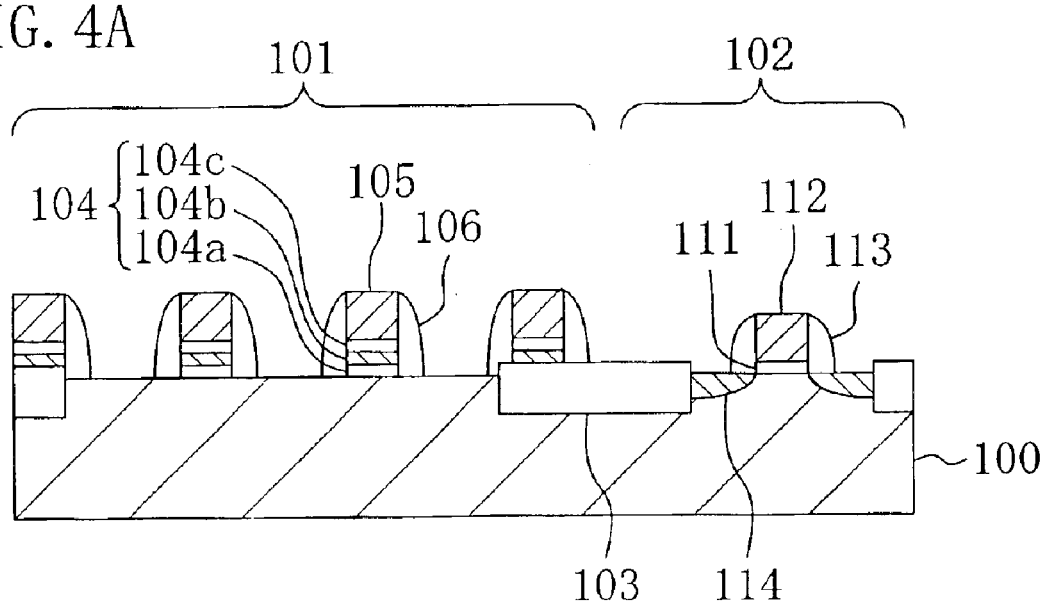
FIGS. 4A, 4B and 4C are cross-sectional views for showing other procedures in the method for fabricating a semiconductor memory of Embodiment 1.
Figure 4B:
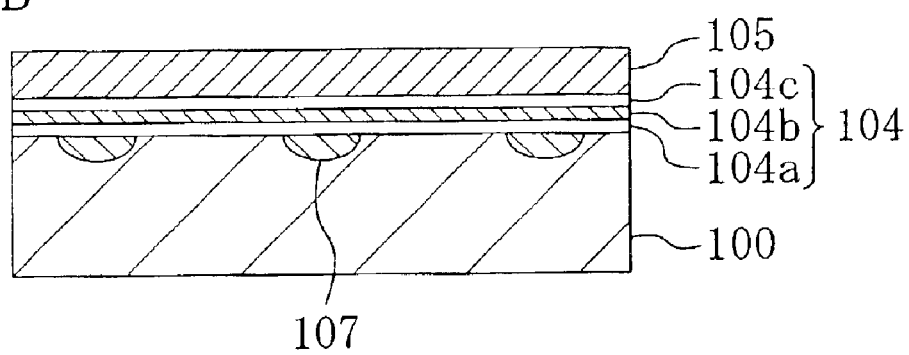
Figure 4C:
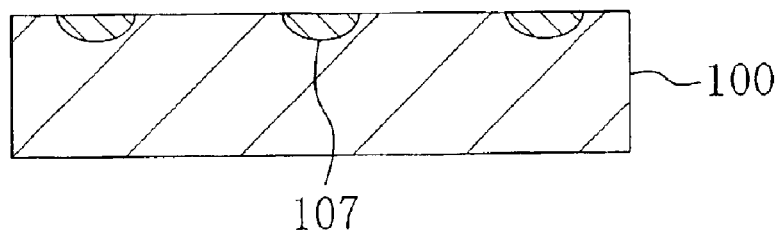

Next, as shown in FIGS. 4A through 4C, in the first active region 101 and the second active region 102, a lower silicon oxide film with a thickness of 10 nm is formed through thermal oxidation. Thereafter, in the first active region 101, an intermediate silicon nitride film with a thickness of 7 nm and an upper silicon oxide film with a thickness of 10 nm are deposited by low pressure CVD. Then, in the first active region 101 and the second active region 102, a polysilicon film with a thickness of approximately 200 nm is deposited by the low pressure CVD. Next, impurity ions such as phosphorus ions are implanted into the polysilicon film at an acceleration voltage of 10 keV and a dose of $2 \times 10^{15}/cm^2$ and annealing is then carried out in a nitrogen atmosphere at a temperature of, for example, 800° C. for 15 minutes. Thereafter, in the first active region 101, the polysilicon film, the upper silicon oxide film, the intermediate silicon nitride film and the lower silicon oxide film are patterned, so as to form a memory gate electrode 105 from the polysilicon film, an upper gate insulating film 104c from the upper silicon oxide film, a capacitor film 104b from the intermediate silicon nitride film and a lower gate insulating film 104a from the lower silicon oxide film. Thus, a memory gate insulating film 104 composed of a multilayer structure including the upper gate insulating film 104c, the capacitor film 104b and the lower gate insulating film 104a is formed below the memory gate electrode 105. On the other hand, in the second active region 102, the polysilicon film and the lower silicon oxide film are patterned, so as to form a logic gate electrode 112 from the polysilicon film and a logic gate insulating film 111 from the lower silicon oxide film.

Next, in the first active region 101 and the second active region 102, a silicon oxide film with a thickness of approximately 100 nm is deposited by the low pressure CVD, and the silicon oxide film is etched back by approximately 110 nm. Thus, a sidewall insulating film 106 is formed on the side faces of the memory gate electrode 105 and the memory insulating film 104 and a sidewall insulating film 113 is formed on the side face of the logic gate electrode 112. Then, in the second active region 102, impurity ions such as arsenic ions are implanted by using the logic gate electrode 112 and the sidewall insulating film 113 as a mask, and annealing is then carried out so as to form impurity diffusion layers 114 working as source and drain regions.

Figure 5A:
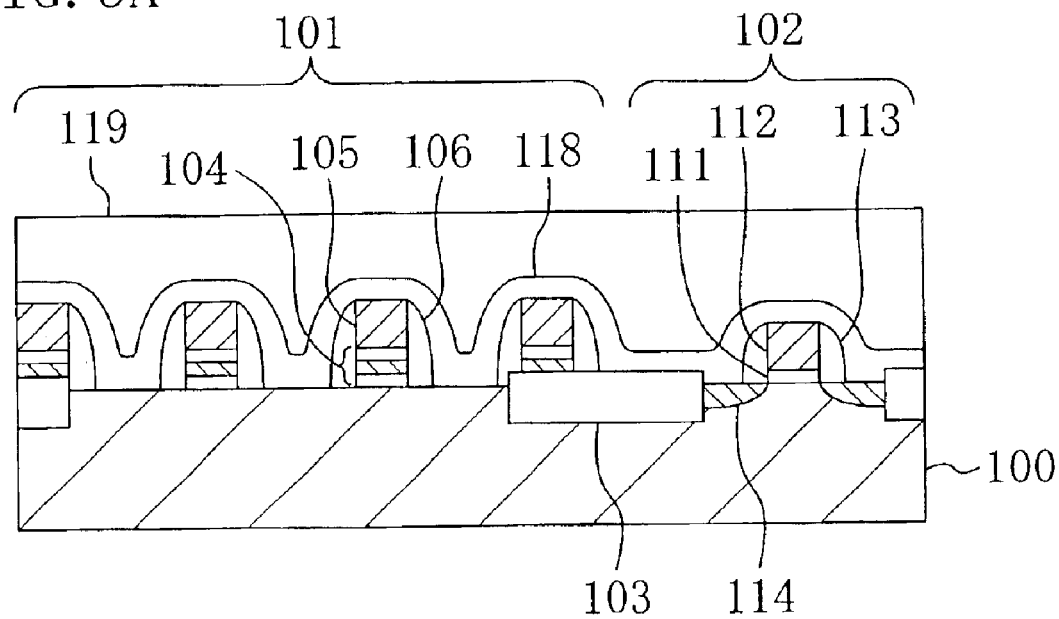
FIGS. 5A, 5B and 5C are cross-sectional views for showing other procedures in the method for fabricating a semiconductor memory of Embodiment 1.
Figure 5B:
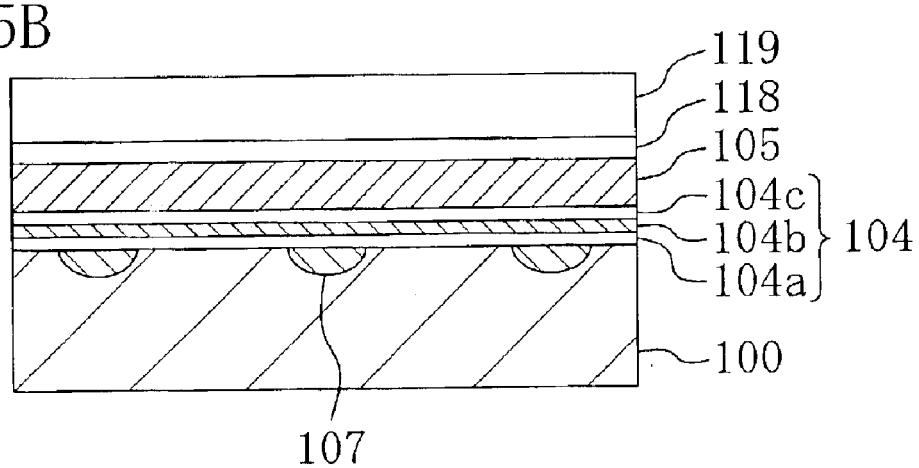
Figure 5C:
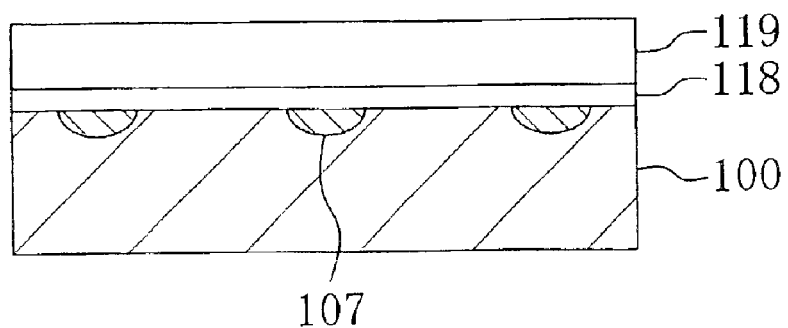

Subsequently, as shown in FIGS. 5A through 5C, in the first active region 101 and the second active region 102, a first insulating film 118 of a silicon oxide film with a thickness of approximately 30 nm is deposited by plasma CVD, and a second insulating film 119 of a BPSG film including 2 wt % of a phosphorus impurity and 7 wt % of a boron impurity is deposited on the first insulating film 118 by atmospheric pressure CVD.

In this manner, the first insulating film 118 and the second insulating film 119 respectively having different etching resistance are deposited and the first insulating film 118 having relatively high etching resistance is deposited in a lower layer in a small thickness and the second insulating film 119 having relatively low etching resistance is deposited in an upper layer in a thickness determined in consideration of a distance between the adjacent memory gate electrodes 105. Therefore, without exposing the top face of the semiconductor substrate 100, the first insulating film 118 and the second insulating film 119 can be filled between the adjacent memory gate electrodes 105 with high controllability.

Figure 6A:
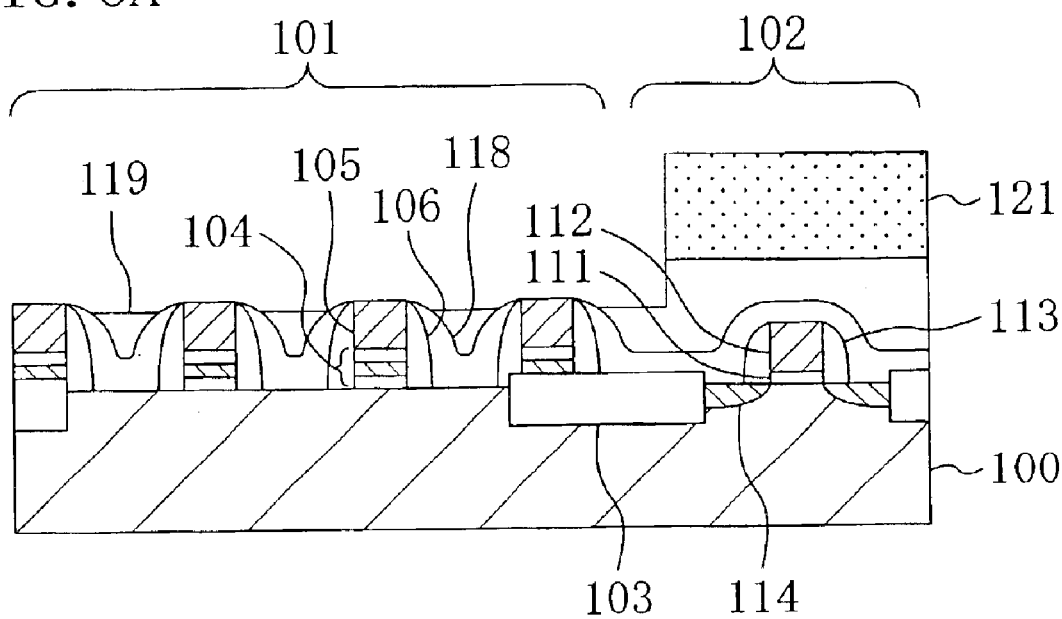
FIGS. 6A, 6B and 6C are cross-sectional views for showing other procedures in the method for fabricating a semiconductor memory of Embodiment 1.
Figure 6B:
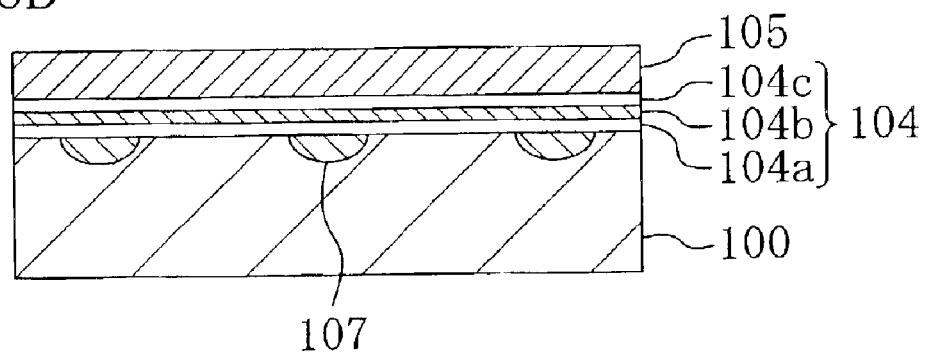
Figure 6C:
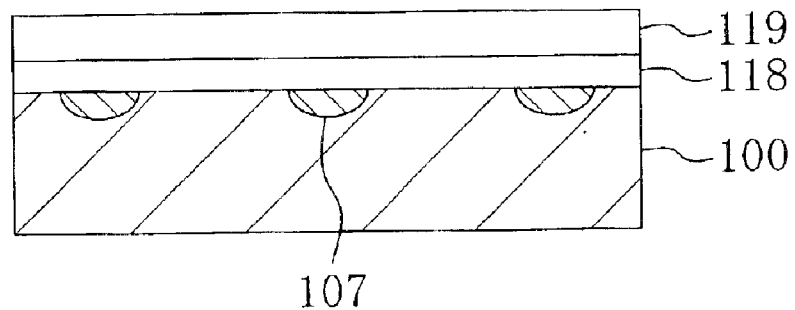

Next, as shown in FIGS. 6A through 6C, a first resist pattern 121 having an opening in the first active region 101 is formed on the second insulating film 119, and the second insulating film 119 and the first insulating film 118 are subjected to anisotropic etching with the first resist pattern 121 used as a mask, so as to expose the top face of the memory gate electrode 105.

Figure 7A:
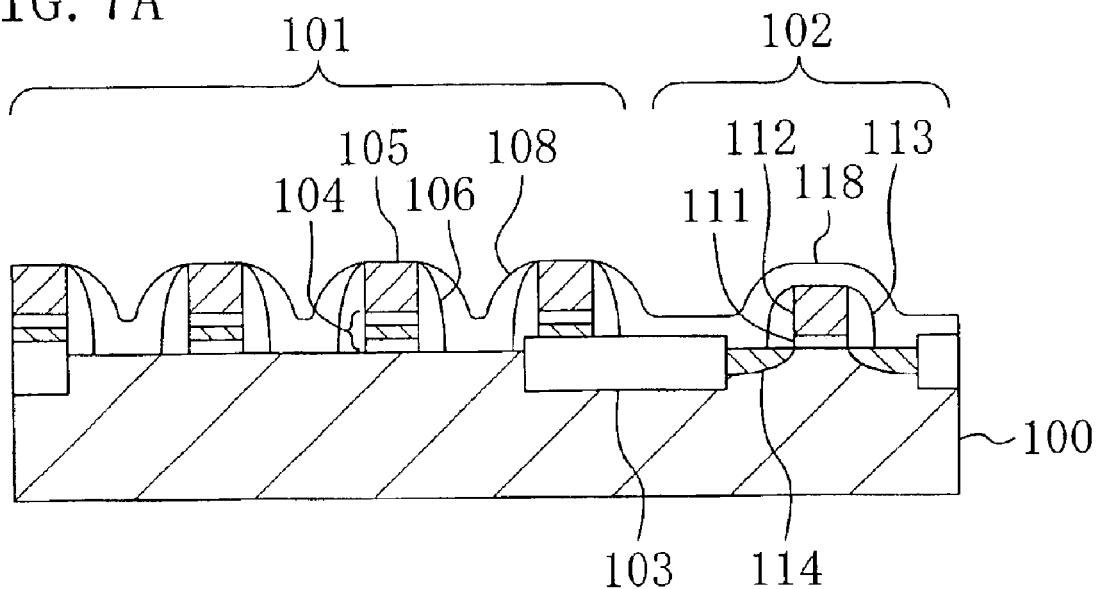
FIGS. 7A, 7B and 7C are cross-sectional views for showing other procedures in the method for fabricating a semiconductor memory of Embodiment 1.
Figure 7B:
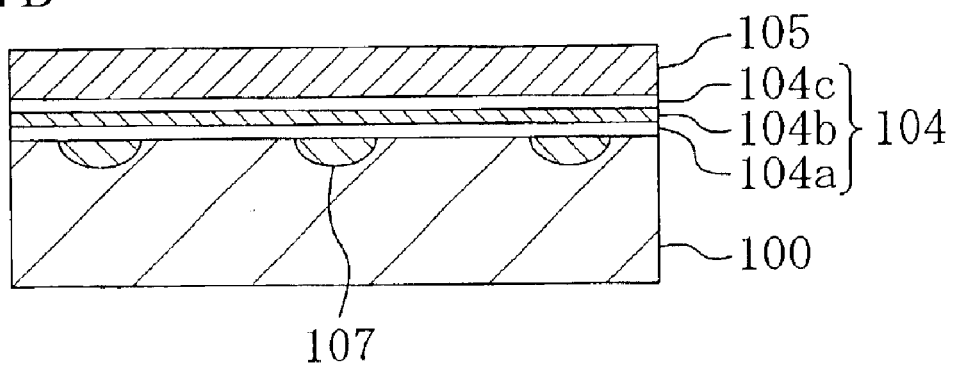
Figure 7C:
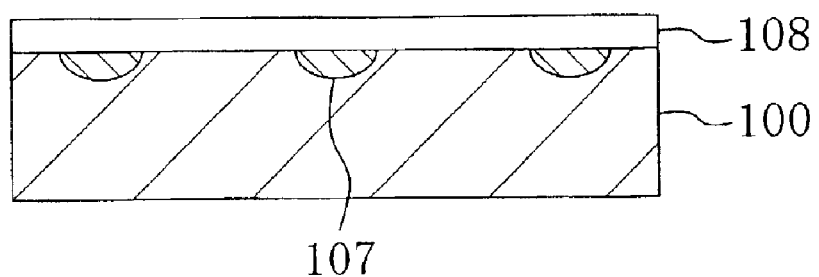

Then, as shown in FIGS. 7A through 7C, after removing the first resist pattern 121, the second insulating film 119 is removed through wet etching using a diluted hydrofluoric acid solution. In this manner, an inter-gate insulating film 108 having the top face at a level lower than the top face of the gate electrode 105 is formed from the first insulating film 118 between the adjacent memory gate electrodes 105 in the first active region 101, and the first insulating film 118 remains in the second active region 102.

Figure 8A:
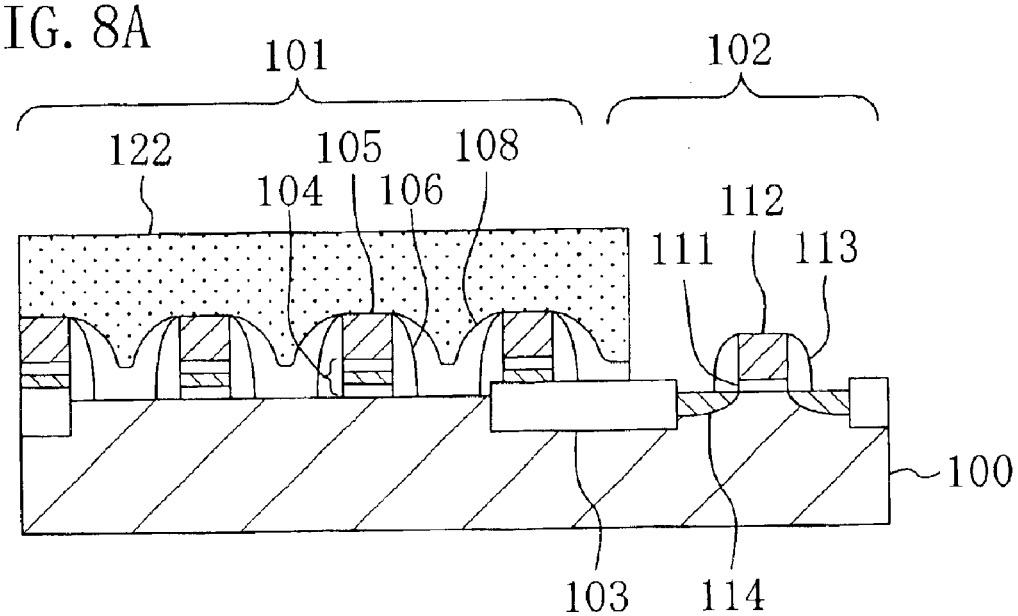
FIGS. 8A, 8B and 8C are cross-sectional views for showing other procedures in the method for fabricating a semiconductor memory of Embodiment 1.
Figure 8B:
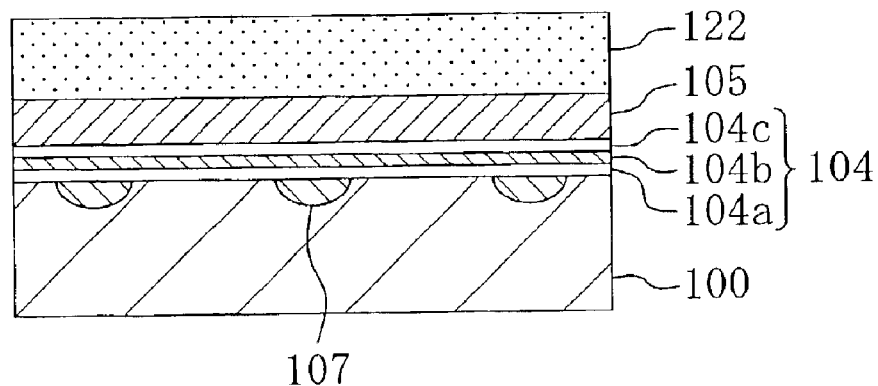
Figure 8C:
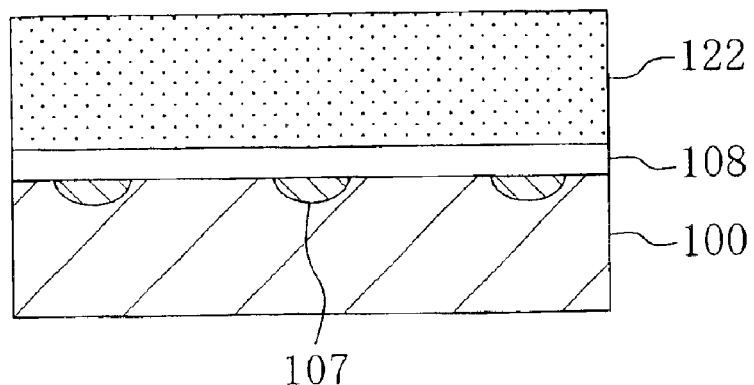

Subsequently, as shown in FIGS. 8A through 8C, a second resist pattern 122 having an opening in the second active region 102 is formed, and the first insulating film 118 is subjected to the wet etching with the second resist pattern 122 used as a mask, so as to remove the first insulating film 118 remaining in the second active region 102. Thus, the top face of the logic gate electrode 112 is exposed.

Figure 9A:
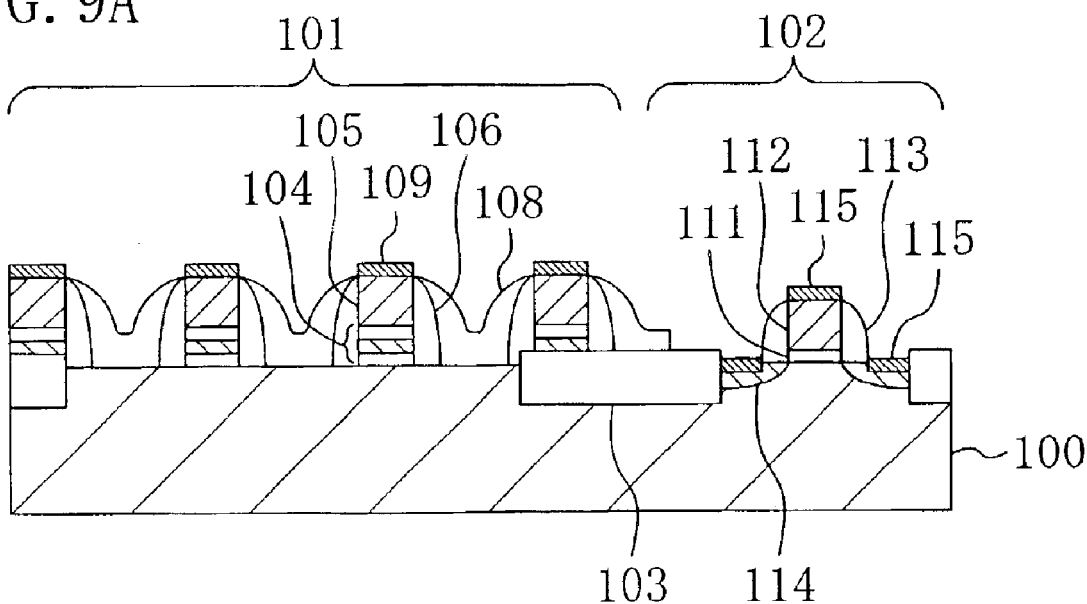
FIGS. 9A, 9B and 9C are cross-sectional views for showing other procedures in the method for fabricating a semiconductor memory of Embodiment 1.
Figure 9B:
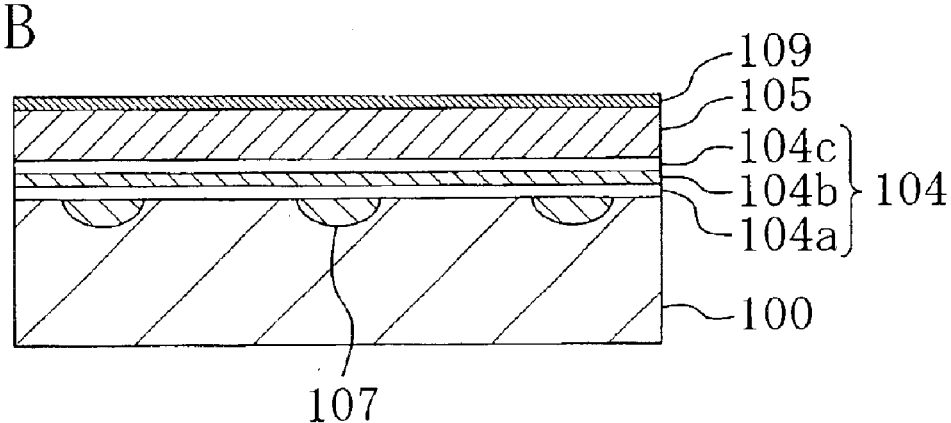
Figure 9C:
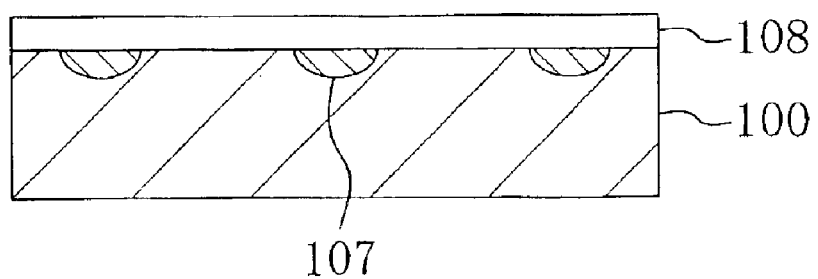

Next, as shown in FIGS. 9A through 9C, salicide technique is employed for forming a silicide layer 109 on the memory gate electrode 105 in the first active region 101 and forming a silicide layer 115 on the logic gate electrode 112 and the impurity diffusion layers 114 in the second active region 102. Thus, the semiconductor memory according to Embodiment 1 is completed.

Although procedures for forming metal interconnects, forming a protection film and forming bonding pads are carried out thereafter, these procedures are not described herein because they are known.

In Embodiment 1, since the salicide technique is practiced with the impurity diffusion layers 107 of the memory transistors covered with the inter-gate insulating film 108, no silicide layer is formed on the impurity diffusion layers 107. Accordingly, the impurity diffusion layers 107 adjacent to each other along the bit line direction are never short-circuited.

Also, since the two insulating films, that is, the first insulating film 118 and the second insulating film 119, having different etching resistance are filled between the adjacent memory gate electrodes 105 by the CVD, the insulating films can be buried in a desired depth regardless of the distance between the adjacent memory gate electrodes 105 by controlling the thicknesses of the first insulating film 118 and the second insulating film 119.

Furthermore, since the memory gate electrode 105 and the logic gate electrode 112 are simultaneously formed, there is no need to provide an excessive margin in forming upper layer contacts above the memory gate electrode 105 and the logic gate electrode 112, and hence, the semiconductor memory can be refined. In the case where an excessive margin is provided in forming the upper layer contacts, the memory gate electrode 105 and the logic gate electrode 112 may be formed in different procedures.

Moreover, although each memory transistor formed in the first active region 101 is a memory device for trapping charge in the memory gate insulating film 104 in Embodiment 1, it may be a memory device for trapping charge in a floating gate electrode instead.

Now, a memory device for trapping charge in a floating gate electrode will be described as a modification of Embodiment 1.

Modification of Embodiment 1

Now, a semiconductor memory according to a modification of Embodiment 1 will be described with reference to FIGS. 1 and 10A through 10C.

Figure 10A:
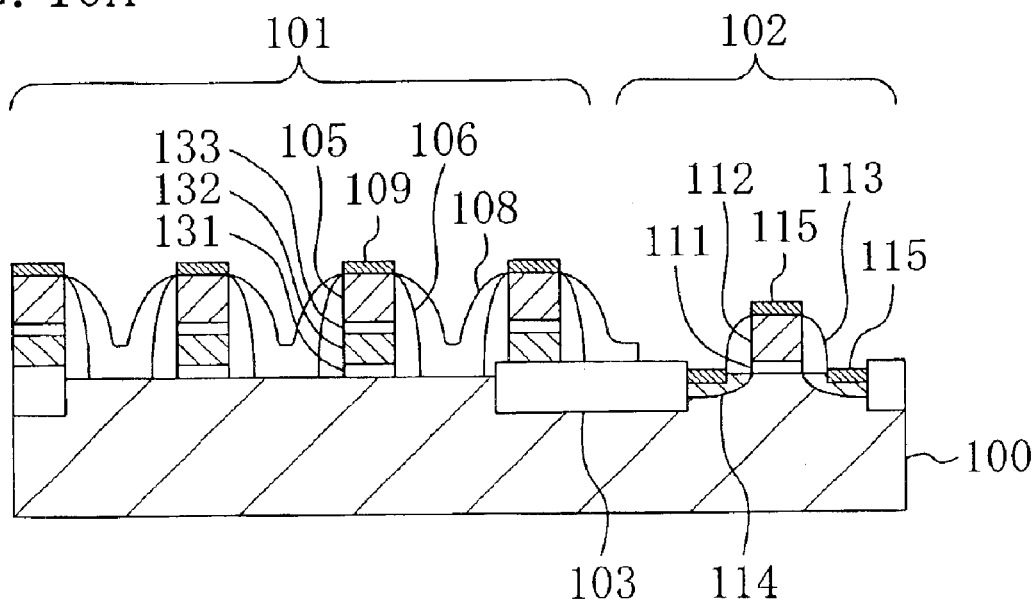
FIGS. 10A, 10B and 10C are cross-sectional views of a semiconductor memory according to a modification of Embodiment 1.
Figure 10B:
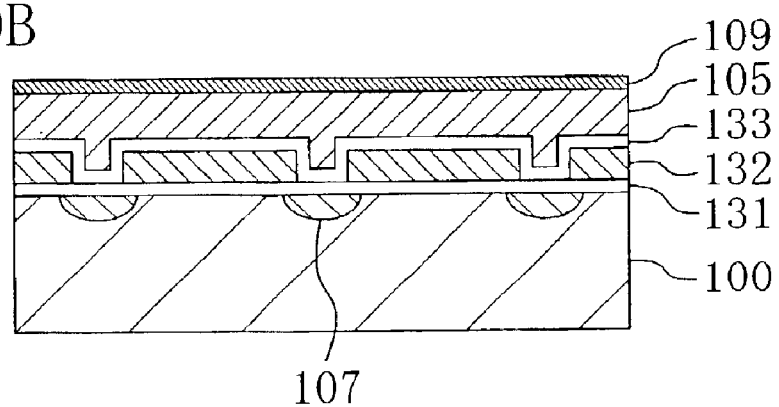
Figure 10C:
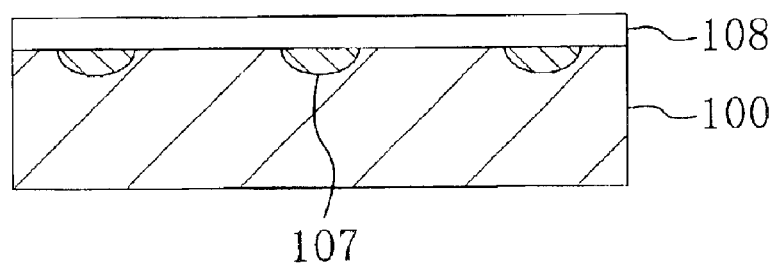

The semiconductor memory of the modification of Embodiment 1 is a floating gate type semiconductor memory having a memory gate and a floating gate. FIG. 10A is a cross-sectional view taken on line Xa—Xa of FIG. 1, FIG. 10B is a cross-sectional view taken on line Xb—Xb of FIG. 1 and FIG. 10C is a cross-sectional view taken on line Xc—Xc of FIG. 1.

As shown in FIGS. 1 and 10A through 10C, a first active region 101 corresponding to a memory region and a second active region 102 corresponding to a logic region that are isolated from each other by an isolation insulating film 103 are formed on a semiconductor substrate 100. A plurality of memory transistors are provided in the form of a matrix in the first active region 101, and a logic transistor is provided in the second active region 102.

In the first active region 101, a tunnel insulating film 131, a floating gate electrode 132, an intermediate insulating film 133 and a memory gate electrode 105 that are included in a memory transistor are formed, and a sidewall insulating film 106 is formed on the side faces of the tunnel insulating film 131, the floating gate electrode 132, the intermediate insulating film 133 and the memory gate electrode 105. Some memory gate electrodes 105 arranged along the word line direction are formed as a common memory gate electrode extending along the word line direction, so that each common memory gate electrode 105 can correspond to a word line. A silicide layer 109 is formed on the memory gate electrode 105.

In the first active region 101, impurity diffusion layers 107 are formed so as to extend in the bit line direction, and the impurity diffusion layers 107 work as source or drain regions of some memory transistors arranged in the bit line direction and correspond to bit lines.

The tunnel insulating film 131, the floating gate electrode 132, the intermediate insulating film 133, the memory gate electrode 105, the silicide layer 109 and the impurity diffusion layers 107 described above together form a memory transistor.

An inter-gate insulating film 108 having its top face at a level lower than the top face of the gate electrode 105 is formed between the adjacent memory gate electrodes 105.

In the second active region 102, a logic gate electrode 112 is formed with a logic insulating film 111 of a silicon oxide film sandwiched between the logic gate electrode 112 and the semiconductor substrate 100, and a sidewall insulating film 113 is formed on the side faces of the logic insulating film 111 and the logic gate electrode 112. Also, in the second active region 102, impurity diffusion layers 114 working as source and drain regions are formed, and a suicide layer 115 is formed on the logic gate electrode 112 and the impurity diffusion layers 114.

The logic insulating film 111, the logic gate electrode 112 and the impurity diffusion layers 114 described above together form a logic transistor.

Now, a method for fabricating the semiconductor memory of the modification of Embodiment 1 will be described with reference to FIGS. 1 and 10A through 10C.

First, in the same manner as in Embodiment 1, a first active region 101 corresponding to a memory region and a second active region 102 corresponding to a logic region are formed, and impurity diffusion layers 107 working as source and drain regions of memory transistors are formed so as to extend in the bit line direction.

Next, in the first active region 101 and the second active region 102, a lower silicon oxide film with a thickness of 10 nm is formed through the thermal oxidation.

Then, in the first active region 101, a first polysilicon film with a thickness of 150 nm is deposited by the low pressure CVD. Thereafter, impurity ions such as phosphorus ions are implanted into the first polysilicon film at an acceleration voltage of 10 keV and a dose of $2 \times 10^{15}/cm^2$, and annealing is then carried out in a nitrogen atmosphere at a temperature of, for example, 800° C. for 15 minutes. Next, the first polysilicon film is patterned so as to form a floating gate electrode 131.

Subsequently, in the first active region 101 and the second active region 102, an upper silicon oxide film with a thickness of 10 nm and a second polysilicon film with a thickness of approximately 200 nm are successively deposited by the low pressure CVD. Then, impurity ions such as phosphorus ions are implanted into the second polysilicon film at an acceleration voltage of 10 keV and a dose of $2\times10^{15}/cm^2$, and annealing is then carried out in a nitrogen atmosphere at a temperature of, for example, 800° C. for 15 minutes. Next, in the first active region 101, the second polysilicon film and the upper silicon oxide film are patterned, so as to form a memory gate electrode 105 from the second polysilicon film and an intermediate insulating film 133 from the upper silicon oxide film. On the other hand, in the second active region 102, the second polysilicon film and the upper silicon oxide film are patterned, so as to form a logic gate electrode 112 from the second polysilicon film and a logic gate insulating film 111 from the upper silicon oxide film.

Next, in the same manner as in Embodiment 1, a sidewall insulating film 106 is formed on the side faces of the tunnel insulating film 131, the floating gate electrode 132, the intermediate insulating film 133 and the memory gate electrode 105 in the first active region 101, and in the second active region 102, a sidewall insulating film 113 is formed on the side faces of the logic gate electrode 112 and the logic gate insulating film 111 and thereafter, impurity diffusion layers 114 working as source and drain regions of the logic transistor are formed.

Then, in the same manner as in Embodiment 1, in the first active region 101, an inter-gate insulating film 108 having the top face at a level lower than the top face of the memory gate electrode 105 is formed between adjacent multilayered structures each composed of the tunnel insulating film 131, the floating gate electrode 131, the intermediate insulating film 132 and the memory gate electrode 105. Thereafter, a silicide layer 109 is formed on the memory gate electrode 105, and a silicide layer 115 is formed on the logic gate electrode 112 and the impurity diffusion layers 114 of the logic transistor. Thus, the semiconductor memory of the modification of Embodiment 1 is completed.

Embodiment 2

Figure 11:
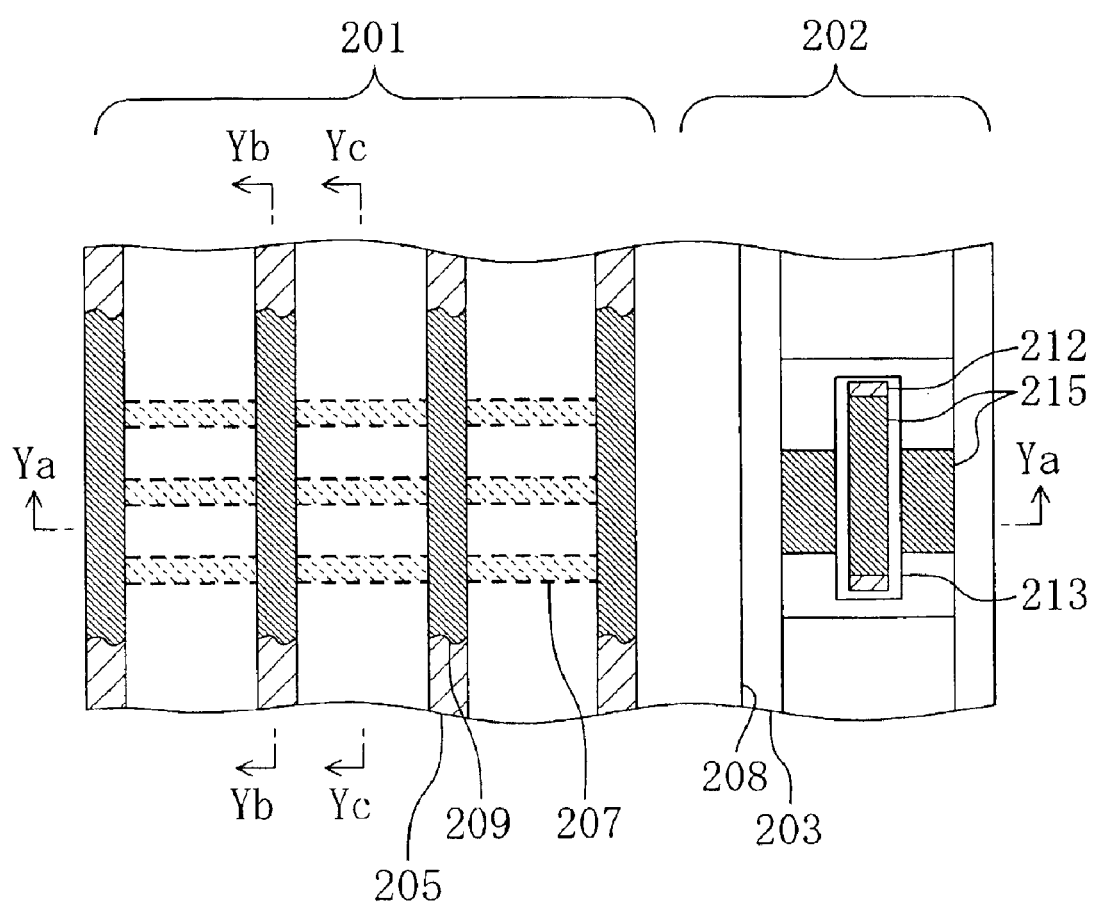
FIG. 11 is a plan view of a semiconductor memory according to Embodiment 2 of the invention.
Figure 12A:
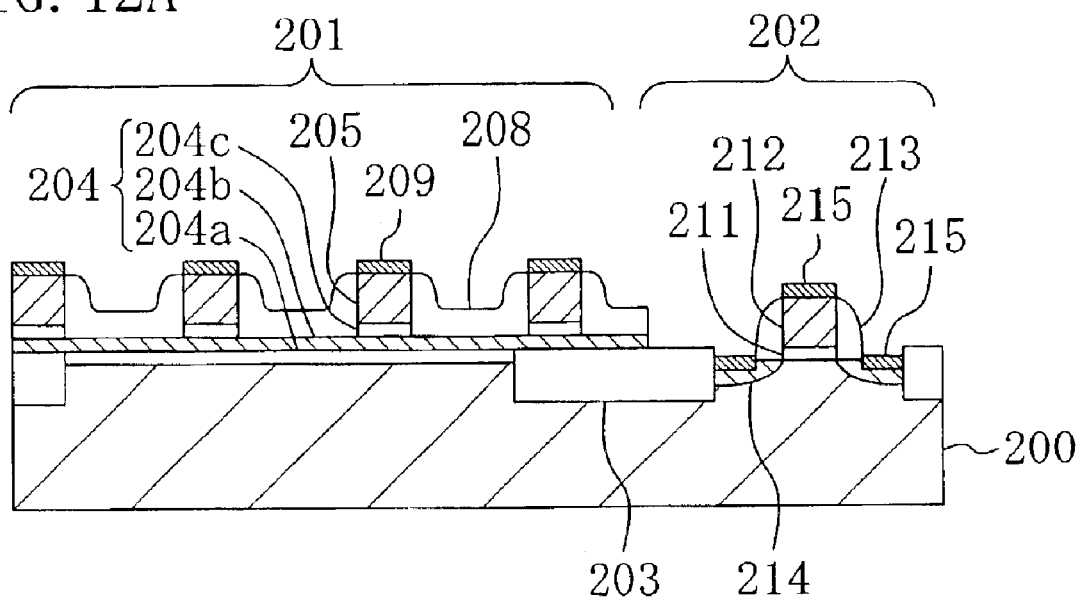
FIG. 12A is a cross-sectional view taken on line Ya—Ya of FIG. 11.
Figure 12B:
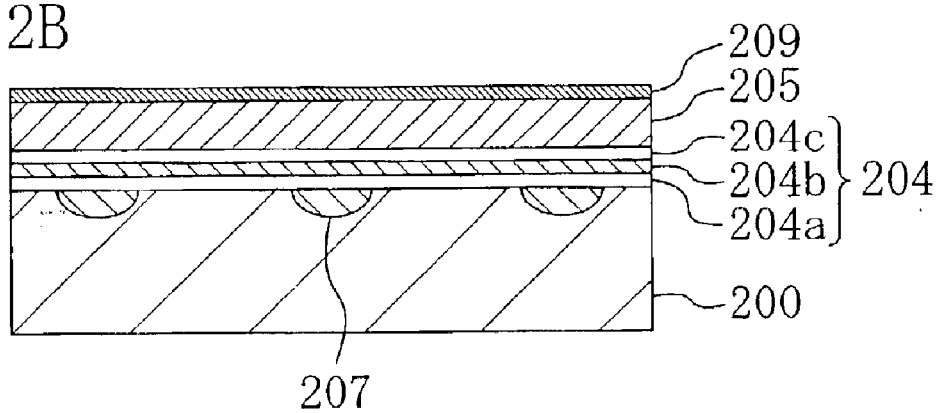
FIG. 12B is a cross-sectional view taken on line Yb—Yb of FIG. 11
Figure 12C:
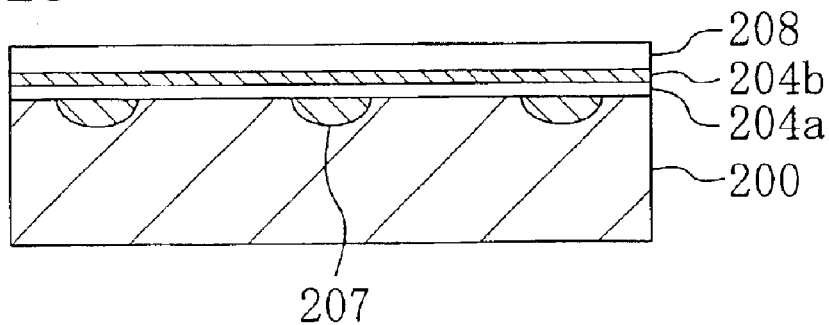
FIG. 12C is a cross-sectional view taken on line Yc—Yc of FIG. 11.

A semiconductor memory according to Embodiment 2 of the invention will now be described with reference to FIGS. 11 and 12A through 12C. FIG. 12A is a cross-sectional view taken on line Ya—Ya of FIG. 11, FIG. 12B is a cross-sectional view taken on line Yb—Yb of FIG. 11 and FIG. 12C is a cross-sectional view taken on line Yc—Yc of FIG. 11.

As shown in FIGS. 11 and 12A through 12C, a first active region 201 corresponding to a memory region and a second active region 202 corresponding to a logic region that are isolated from each other by an isolation insulating film 203 are formed on a semiconductor substrate 200. A plurality of memory transistors are provided in the form of a matrix in the first active region 201, and a logic transistor is provided in the second active region 202.

In the first active region 201, a memory gate electrode 205 is formed with a memory insulating film 204 sandwiched between the memory gate electrode 205 and the semiconductor substrate 200, and the memory insulating film 204 is composed of a multilayer structure including a lower gate insulating film 204a of a silicon oxide film, a capacitor film 204b of a silicon nitride film and an upper gate insulating film 204c of a silicon oxide film. Some memory gate electrodes 205 arranged along the word line direction are formed as a common gate electrode extending in the word line direction, so that each common gate electrode 205 can correspond to a word line. A suicide layer 209 is formed on the memory gate electrode 205.

In the first active region 201, impurity diffusion layers 207 are formed so as to extend in the bit line direction, and the impurity diffusion layers 207 work as source or drain regions of some memory transistors arranged along the bit line direction and correspond to bit lines.

The memory insulating film 204, the memory gate electrode 205, the silicide layer 209 and the impurity diffusion layers 207 described above together form a memory transistor.

An inter-gate insulating film 208 having its top face at a level lower than the top face of the memory gate electrode 205 is formed between the adjacent memory gate electrodes 205.

In the second active region 202, a logic gate electrode 212 is formed with a logic gate insulating film 211 of a silicon oxide film sandwiched between the logic gate electrode 212 and the semiconductor substrate 200, and a sidewall insulating film 213 is formed on the side face of the logic gate electrode 212. Also in the second active region 202, impurity diffusion layers 214 working as source and drain regions are formed, and a silicide layer 215 is formed on the logic gate electrode 212 and the impurity diffusion layers 214.

The logic gate insulating film 211, the logic gate electrode 212 and the impurity diffusion layers 214 described above together form a logic transistor.

Now, a method for fabricating the semiconductor memory of Embodiment 2 will be described with reference to FIGS. 13A through 13C, 14A through 14C, 15A through 15C, 16A through 16C, 17A through 17C and 18A through 18C. FIGS. 13A, 14A, 15A, 16A, 17A and 18A are cross-sectional views taken on line Ya—Ya of FIG. 11, FIGS. 13B, 14B, 15B, 16B, 17B and 18B are cross-sectional views taken on line Yb—Yb of FIG. 11 and FIGS. 13C, 14C, 15C, 16C, 17C and 18C are cross-sectional views taken on line Yc—Yc of FIG. 11.

Figure 13A:
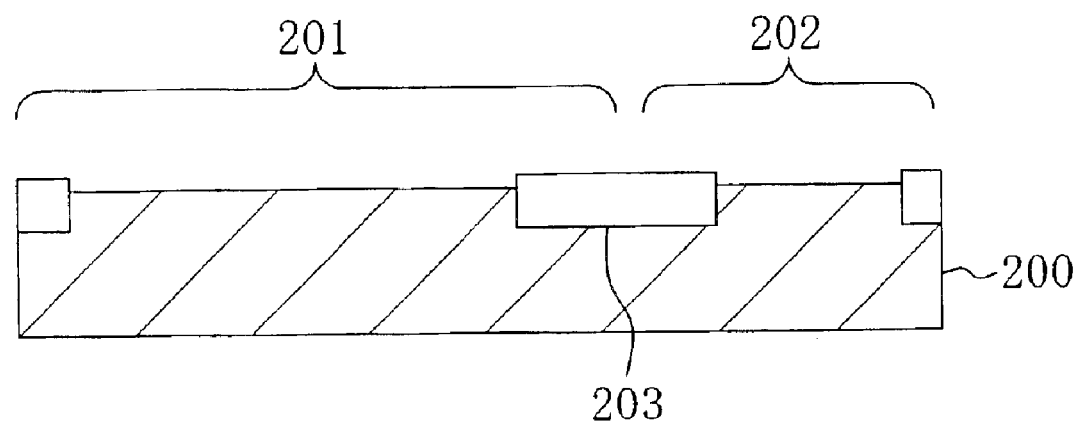
FIGS. 13A, 13B and 13C are cross-sectional views for showing procedures in a method for fabricating a semiconductor memory of Embodiment 2.
Figure 13B:
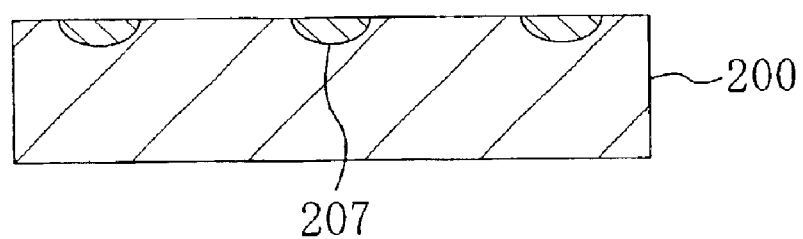
Figure 13C:
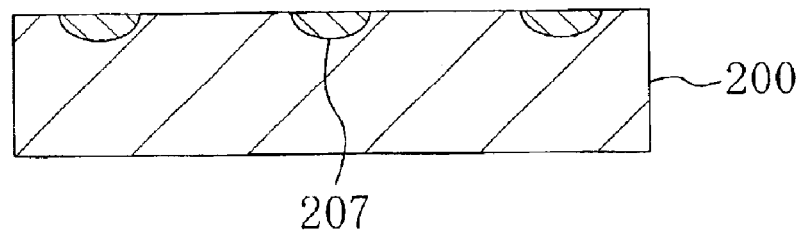

First, as shown in FIGS. 13A through 13C, an isolation insulating film 203 is formed in a surface portion of a semiconductor substrate 200 by filling a silicon oxide film in a groove with a depth of approximately 300 nm, so as to form a first active region 201 corresponding to a memory region and a second active region 202 corresponding to a logic region. Next, impurity ions such as arsenic ions are implanted into predetermined portions of the first active region 201 at an acceleration voltage of 50 keV and a dose of $5\times101^5/cm^2$, and annealing is then carried out in a nitrogen atmosphere at a temperature of, for example, 900° C. for 60 minutes. Thus, impurity diffusion layers 207 working as source and drain regions of memory transistors are formed so as to extend in the bit line direction.

Figure 14A:
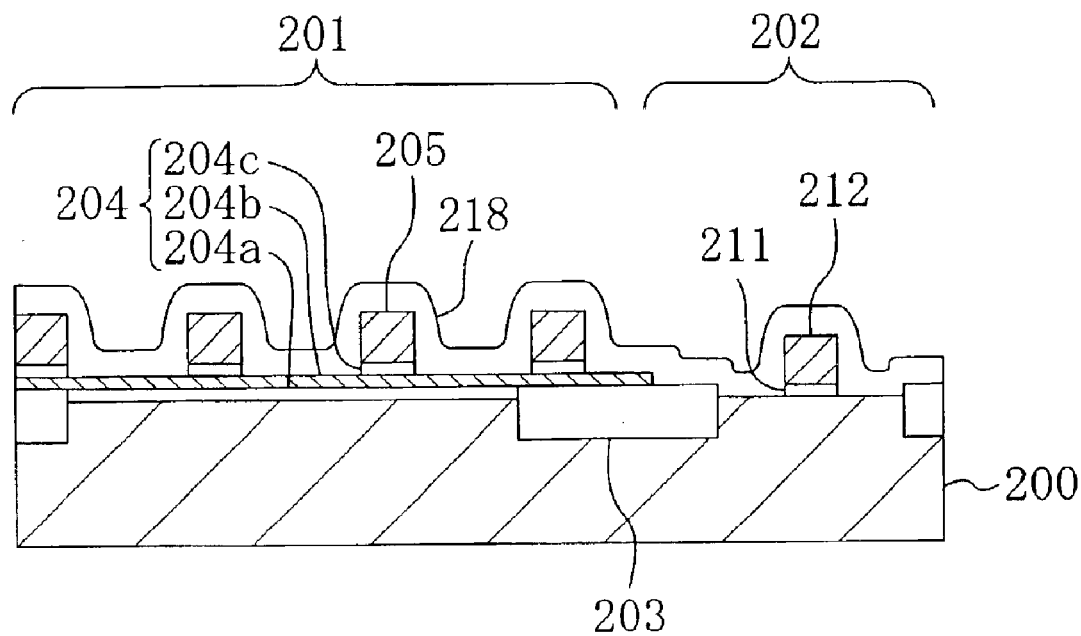
FIGS. 14A, 14B and 14C are cross-sectional views for showing other procedures in the method for fabricating a semiconductor memory of Embodiment 2.
Figure 14B:
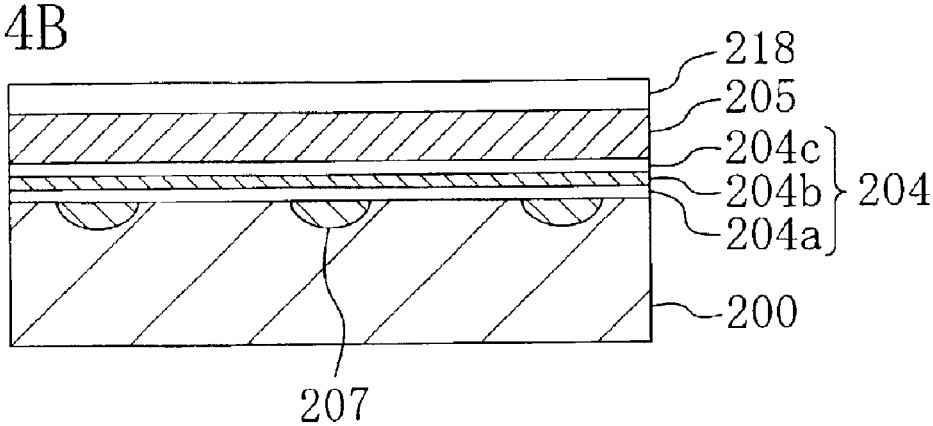
Figure 14C:
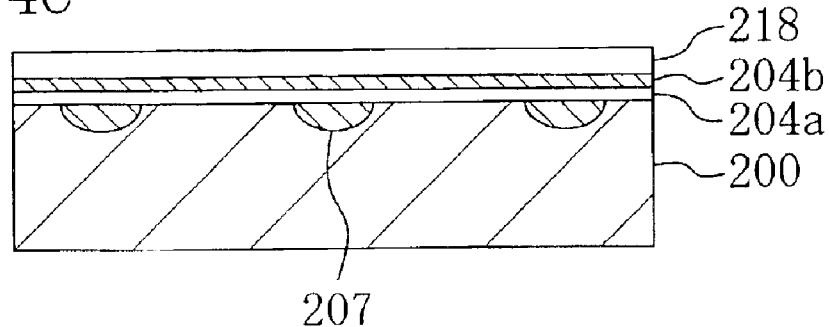

Next, as shown in FIGS. 14A through 14C, in the first active region 201 and the second active region 202, a lower silicon oxide film with a thickness of 10 nm is formed through the thermal oxidation. Thereafter, in the first active region 201, an intermediate silicon nitride film with a thickness of 7 nm and an upper silicon oxide film with a thickness of 10 nm are deposited by the low pressure CVD. Then, in the first active region 201 and the second active region 202, a polysilicon film with a thickness of approximately 200 nm is deposited by the low pressure CVD. Next, impurity ions such as phosphorus ions are implanted into the polysilicon film at an acceleration voltage of 10 keV and a dose of $2\times10/^5/cm^2$ and annealing is then carried out in a nitrogen atmosphere at a temperature of, for example, 800° C. for 15 minutes. Thereafter, in the first active region 201, the polysilicon film and the upper silicon oxide film are patterned, so as to form a memory gate electrode 205 from the polysilicon film and an upper gate insulating film 204c from the upper silicon oxide film. Thus, a memory gate insulating film 204 composed of a multilayer structure including the upper gate insulating film 204c, a capacitor film 204b of the silicon nitride film not patterned and a lower gate insulating film 204a of the lower silicon oxide film not patterned is formed below the memory gate electrode 205. On the other hand, in the second active region 202, the polysilicon film and the lower silicon oxide film are patterned, so as to form a logic gate electrode 212 from the polysilicon film and a logic gate insulating film 211 from the lower silicon oxide film.

Next, in the first active region 201 and the second active region 202, a first insulating film 218 of a silicon oxide film with a thickness of approximately 30 nm is deposited by plasma CVD.

Figure 15A:
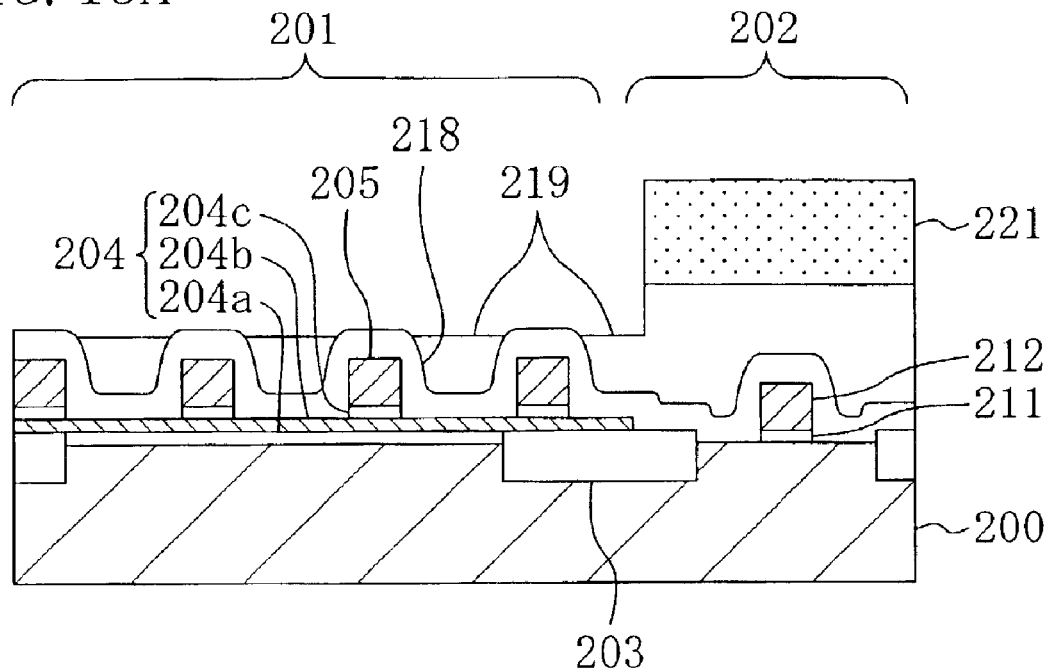
FIGS. 15A, 15B and 15C are cross-sectional views for showing other procedures in the method for fabricating a semiconductor memory of Embodiment 2.
Figure 15B:
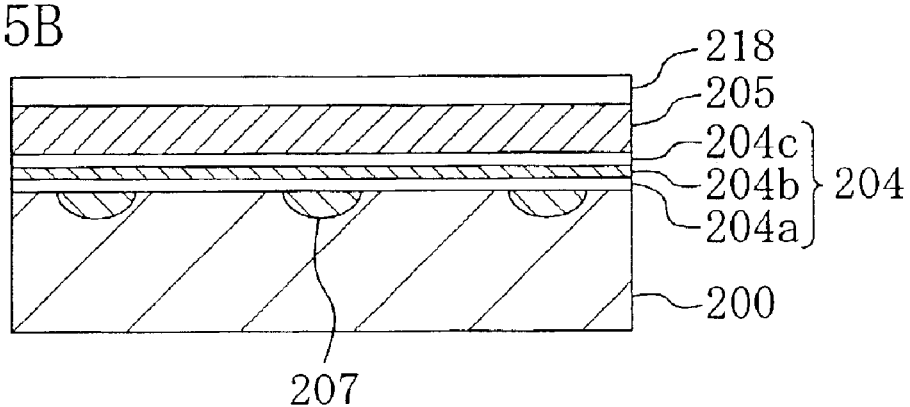
Figure 15C:
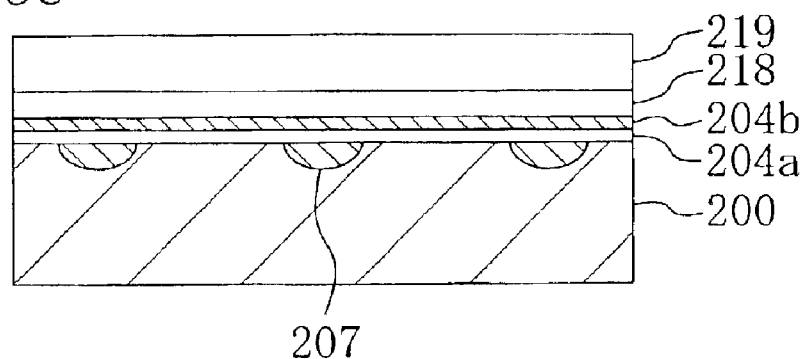

Subsequently, as shown in FIGS. 15A through 15C, in the first active region 201 and the second active region 202, a second insulating film 219 of a BPSG film including 2 wt % of a phosphorus impurity and 7 wt % of a boron impurity is deposited on the first insulating film 118 by the atmospheric pressure CVD. Then, a first resist pattern 221 having an opening in the first active region 201 is formed on the second insulating film 219, and the second insulating film 219 is subjected to the anisotropic etching with the first resist pattern 221 used as a mask, so as to expose a portion of the first insulating film 218 above the memory gate electrode 205 in the first active region 201.

Figure 16A:
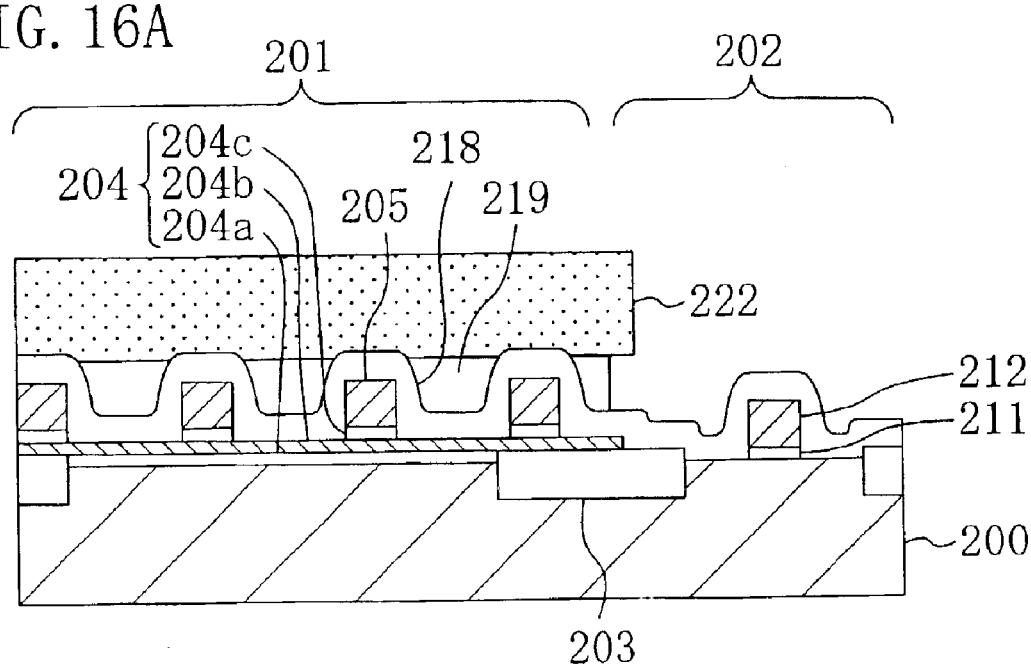
FIGS. 16A, 16B and 16C are cross-sectional views for showing other procedures in the method for fabricating a semiconductor memory of Embodiment 2.
Figure 16B:
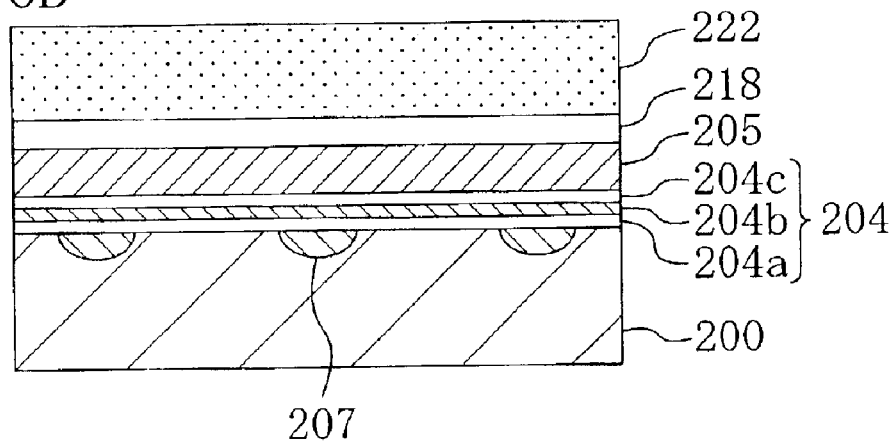
Figure 16C:
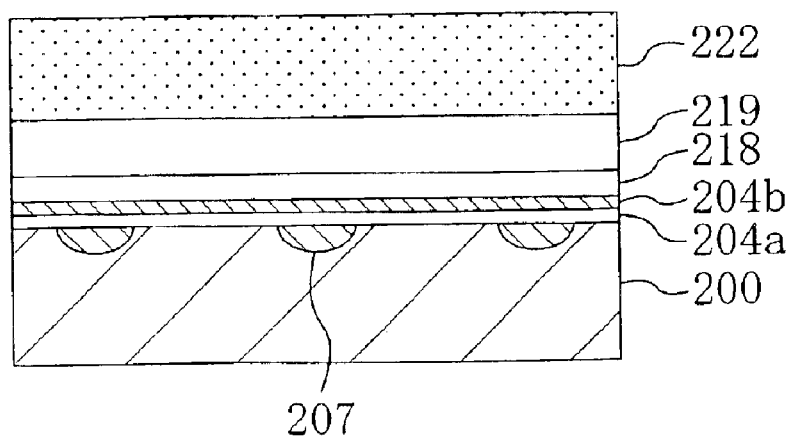

Then, as shown in FIGS. 16A through 16C, after forming a resist pattern 222 having an opening in the second active region 204, the second insulating film 219 is subjected to the wet etching using a diluted hydrofluoric acid solution with the second resist pattern 222 used as a mask, so as to remove the second insulating film 219 in the second active region 204.

Figure 17A:
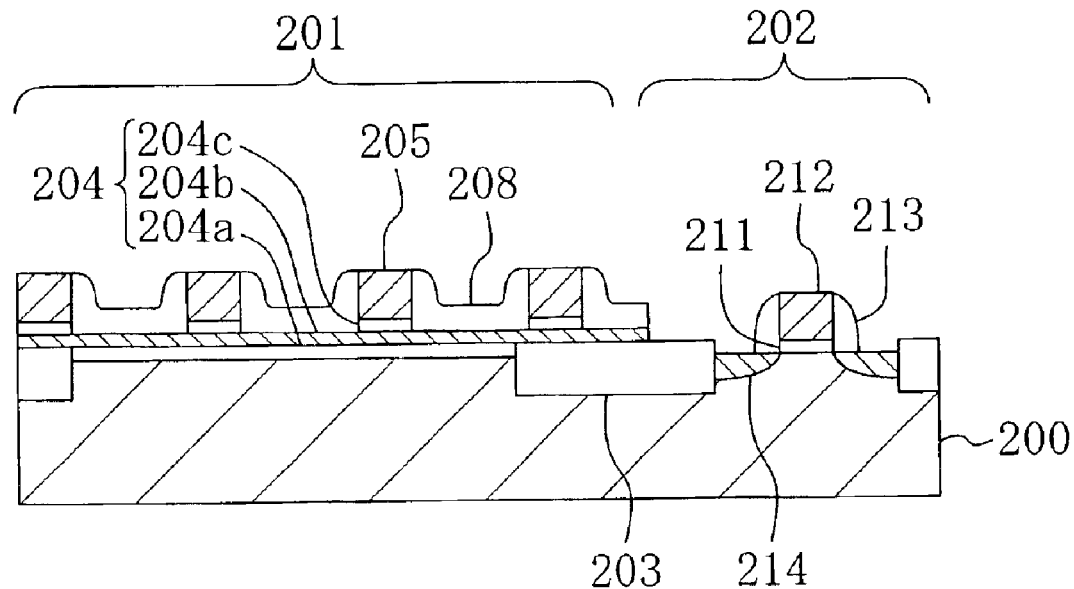
FIGS. 17A, 17B and 17C are cross-sectional views for showing other procedures in the method for fabricating a semiconductor memory of Embodiment 2.
Figure 17B:
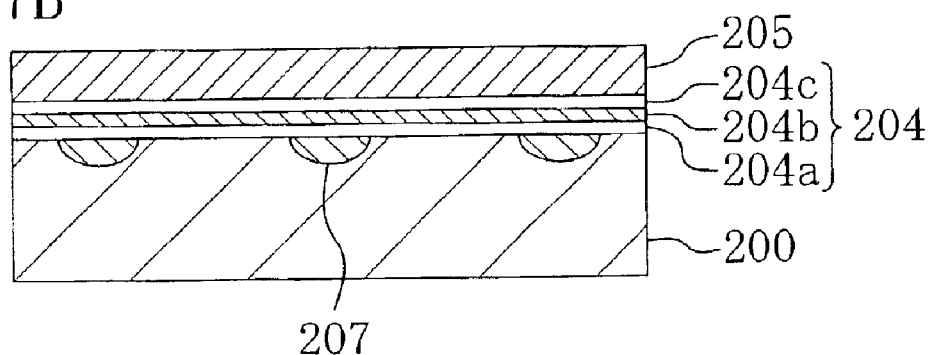
Figure 17C:
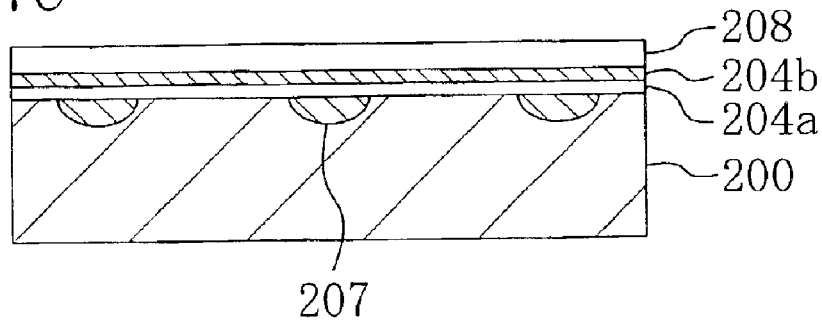

Next, as shown in FIGS. 17A through 17C, after removing the second resist pattern 222, the first insulating film 218 is etched back by approximately 110 nm. Thus, an inter-gate insulating film 208 having the top face at a level lower than the top face of the memory gate electrode 205 is formed between the adjacent memory gate electrodes 205 in the first active region 201, and a sidewall insulating film 213 is formed on the side face of the logic gate electrode 212 in the second active region 202.

Then, in the second active region 202, impurity ions such as arsenic ions are implanted by using the logic gate electrode 212 and the sidewall insulating film 213 as a mask, and annealing is then carried out so as to form impurity diffusion layers 214 working as source and drain regions. Thereafter, the remaining second insulating film 219 is removed by the wet etching.

Figure 18A:
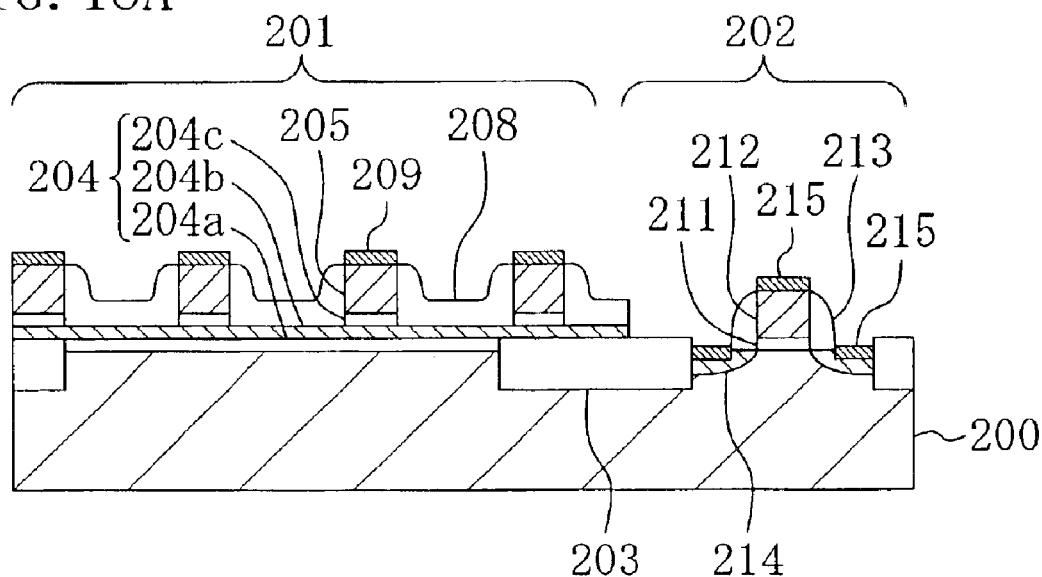
FIGS. 18A, 18B and 18C are cross-sectional views for showing other procedures in the method for fabricating a semiconductor memory of Embodiment 2.
Figure 18B:
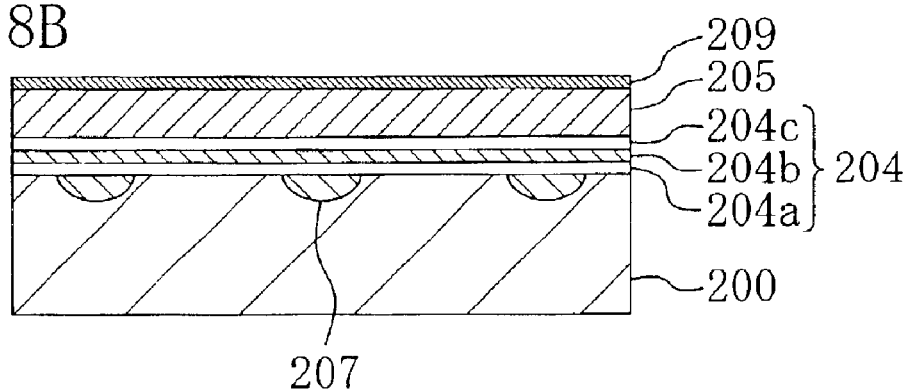
Figure 18C:
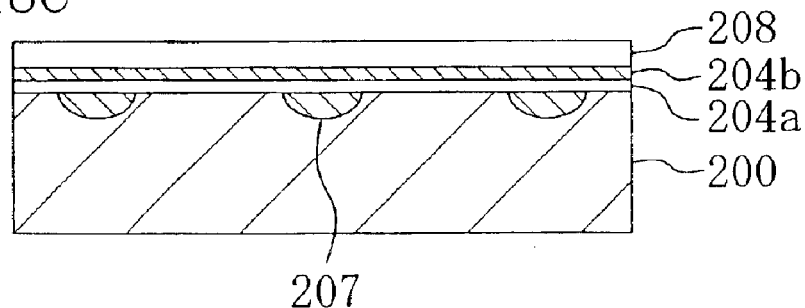
Figure 19:
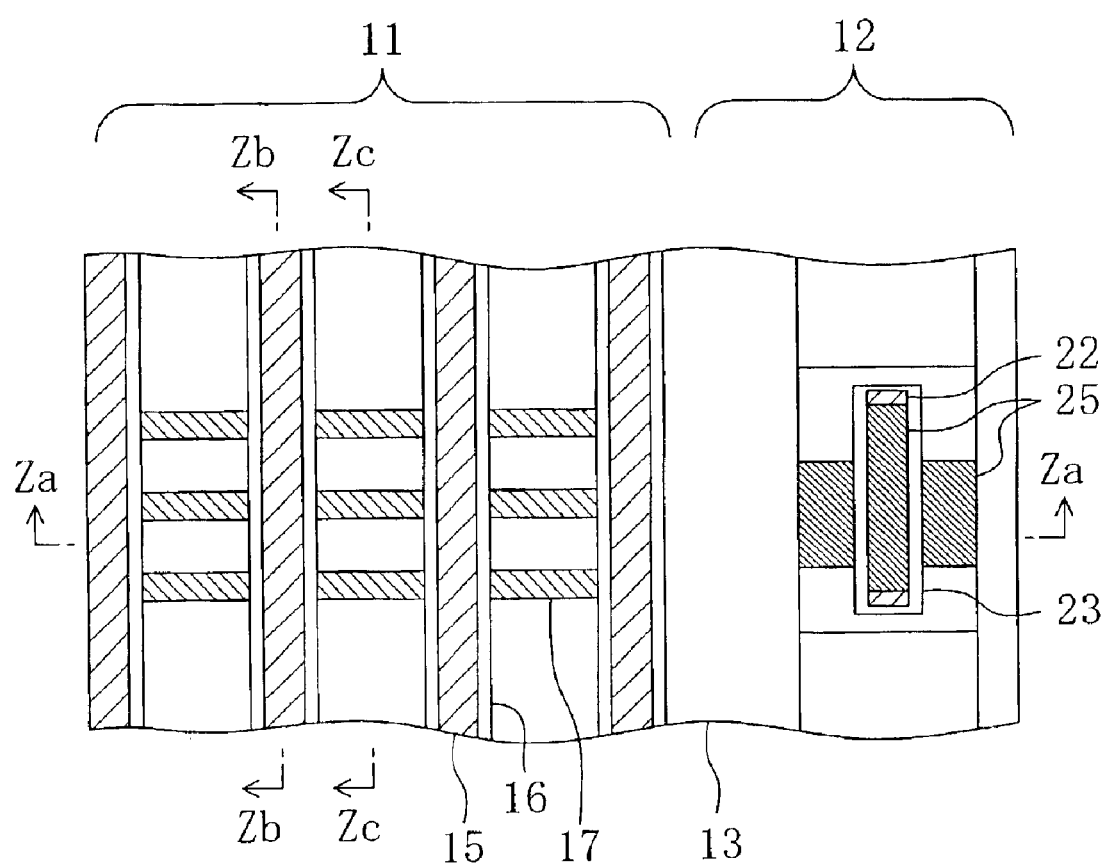
FIG. 19 is a plan view of a conventional semiconductor memory.
Figure 20A:
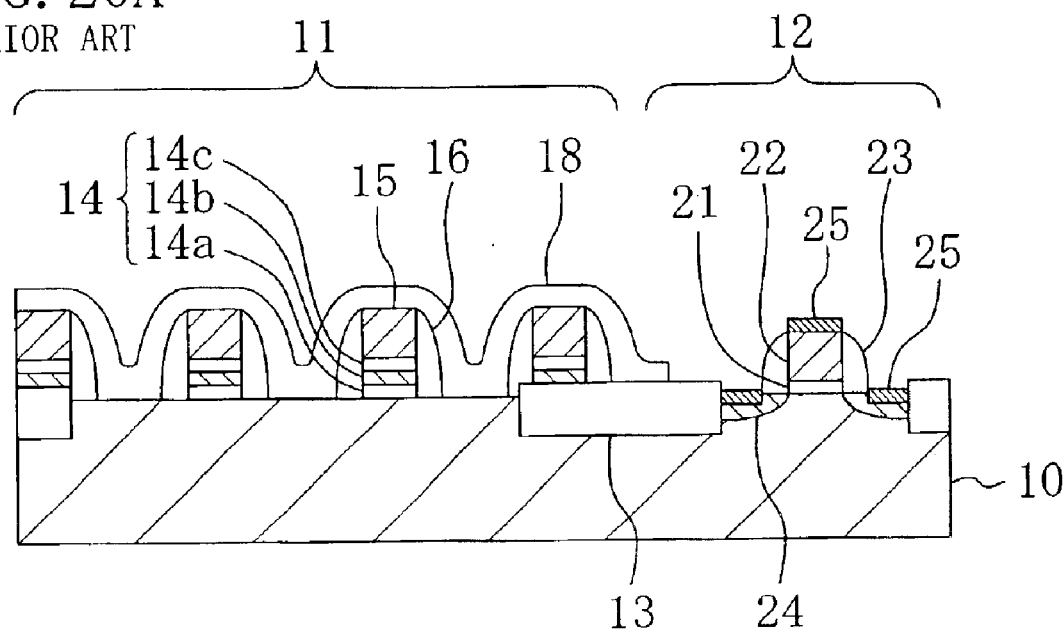
FIG. 20A is a cross-sectional view taken on line Za—Za of FIG. 19.
Figure 20B:
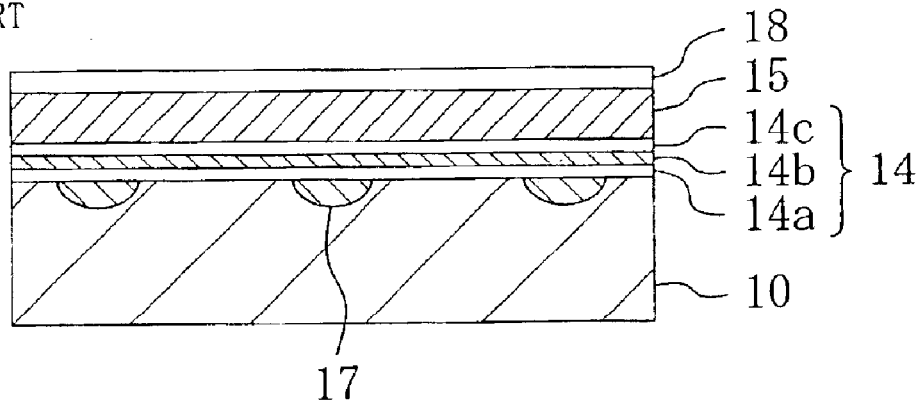
FIG. 20B is a cross-sectional view taken on line Zb—Zb of FIG. 19
Figure 20C:
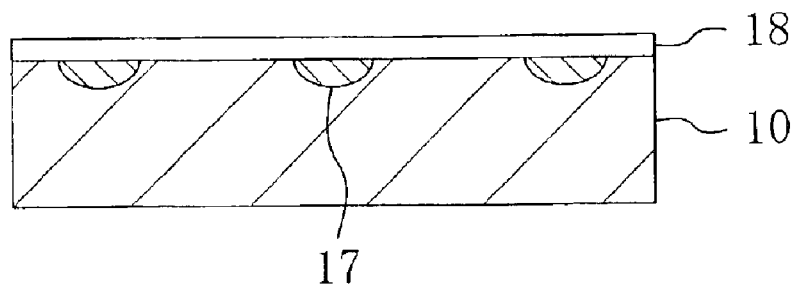
FIG. 20C is a cross-sectional view taken on line Zc—Zc of FIG. 19.
Figure 21A:
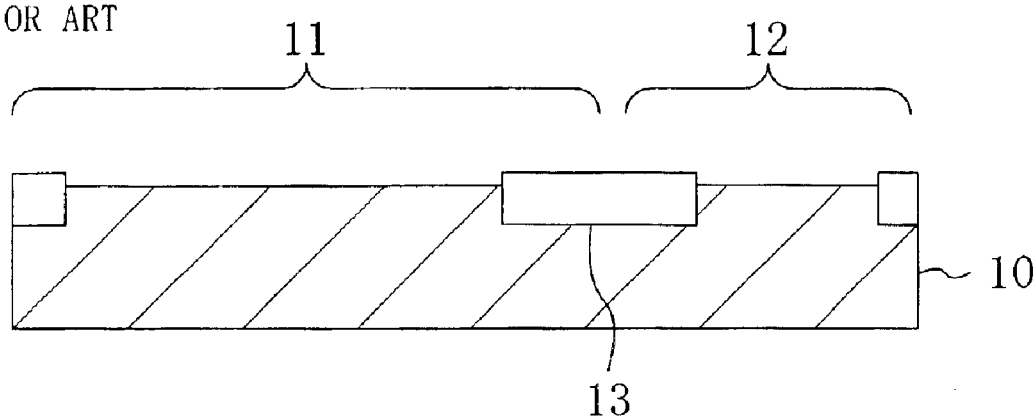
FIGS. 21A, 21B and 21C are cross-sectional views for showing procedures in a conventional method for fabricating a semiconductor memory.
Figure 21B:
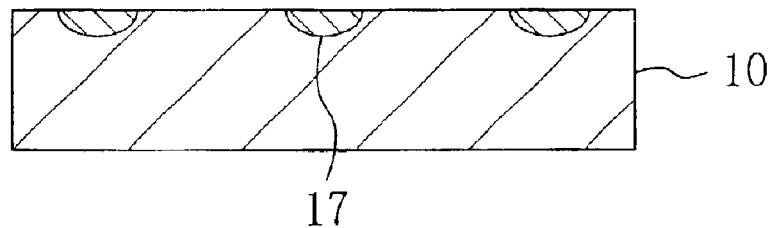
Figure 21C:
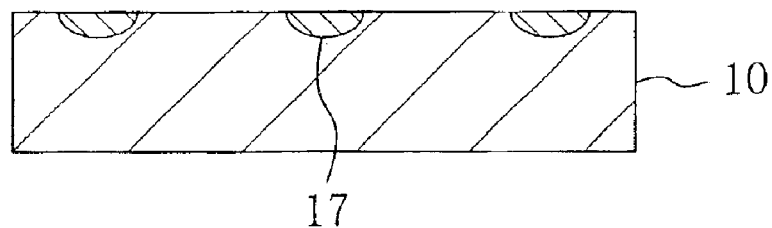
Figure 22A:
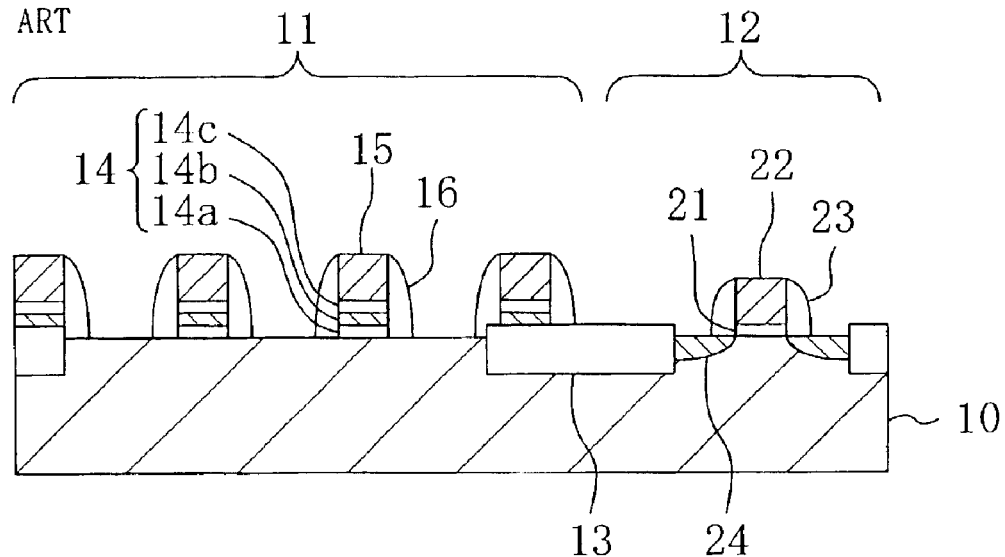
FIGS. 22A, 22B and 22C are cross-sectional views for showing other procedures in the conventional method for fabricating a semiconductor memory.
Figure 22B:
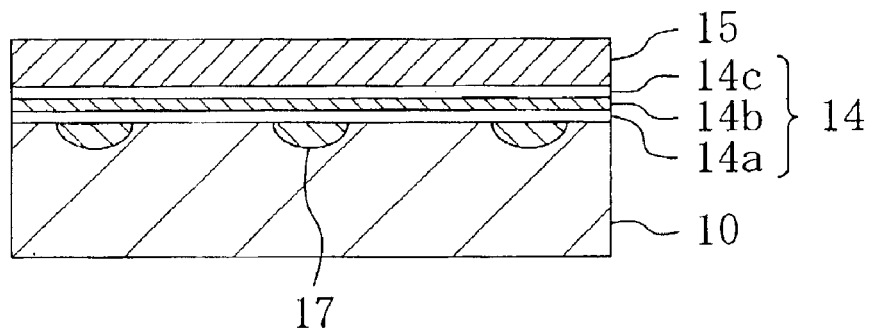
Figure 22C:
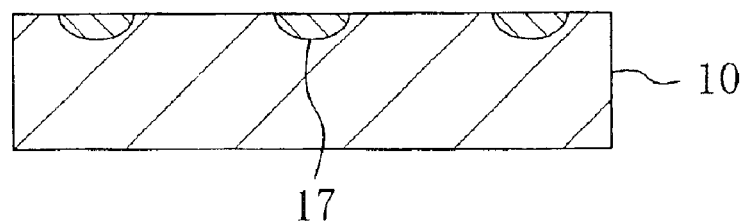
Figure 23A:
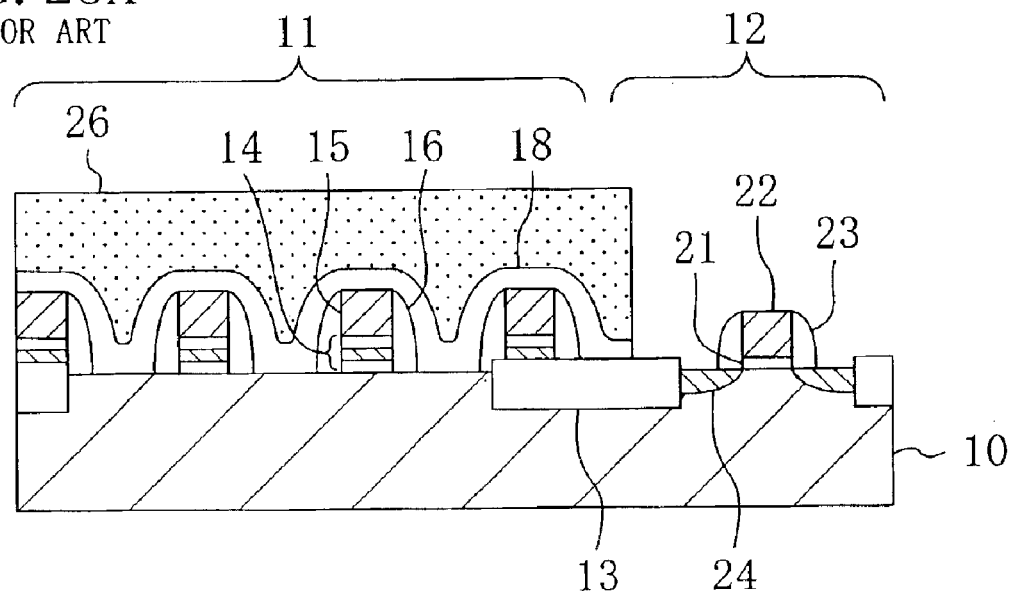
FIGS. 23A, 23B and 23C are cross-sectional views for showing other procedures in the conventional method for fabricating a semiconductor memory.
Figure 23B:
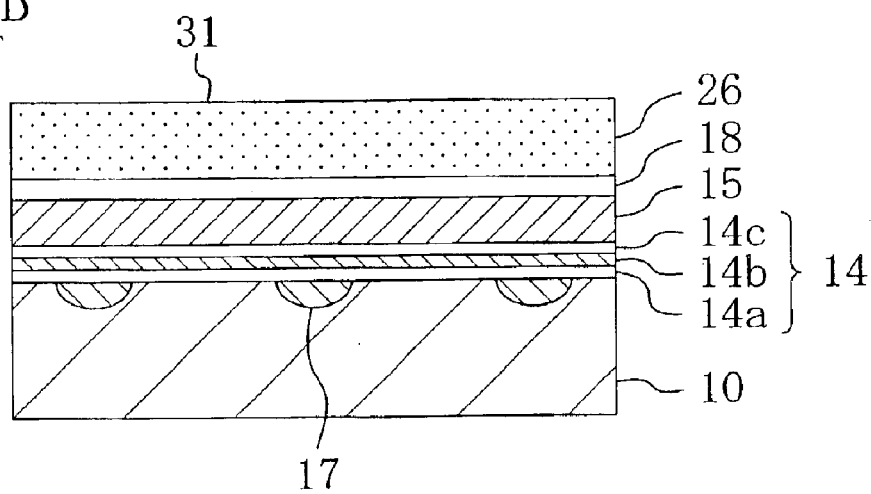
Figure 23C:
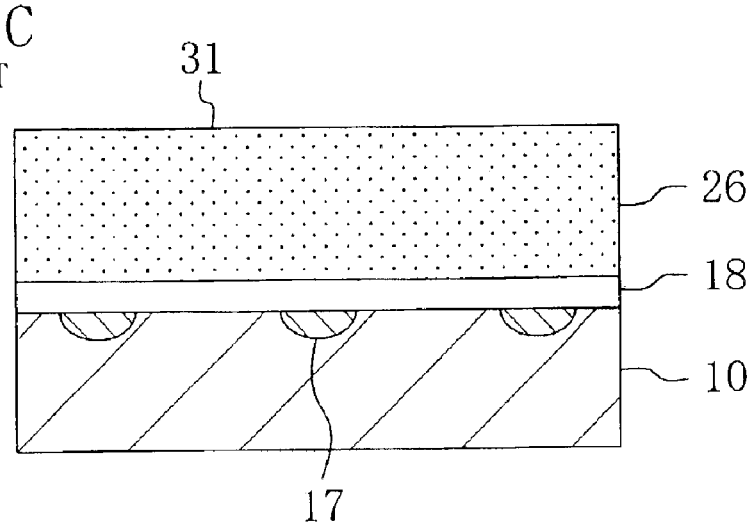
Figure 24A:
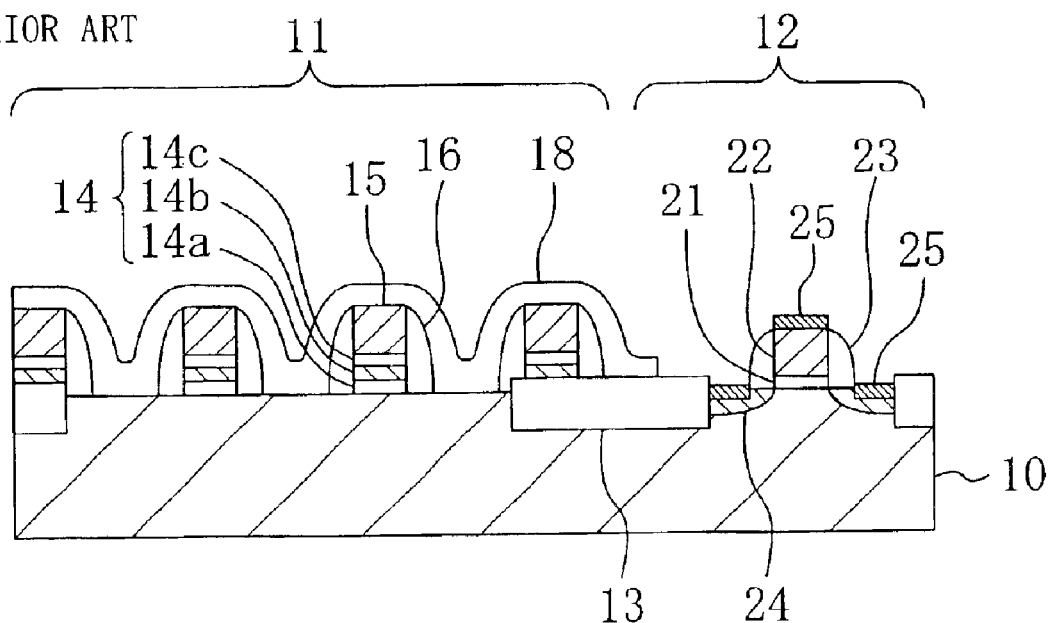
FIGS. 24A, 24B and 24C are cross-sectional views for showing other procedures in the conventional method for fabricating a semiconductor memory.
Figure 24B:
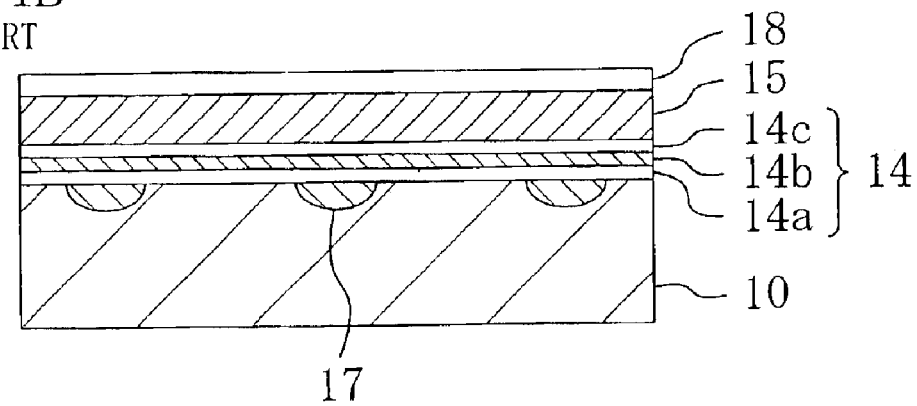
Figure 24C:
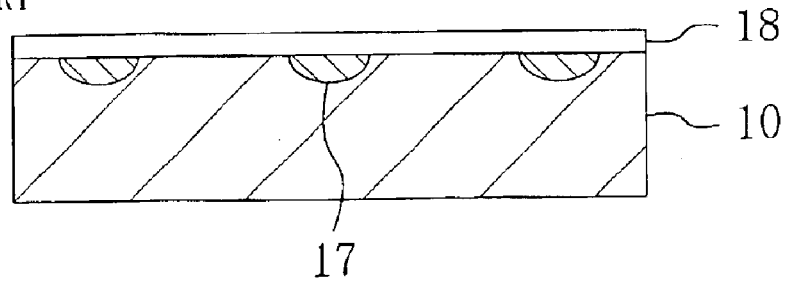

Subsequently, as shown in FIGS. 18A through 18C, a silicide layer 209 and a silicide layer 215 are respectively formed on the memory gate electrode 205 in the first active region 201 and on the logic gate electrode 212 and the impurity diffusion layers 214 in the second active region 202 by the salicide technique. In this manner, the semiconductor memory of Embodiment 2 is completed.

Although procedures for forming metal interconnects, forming a protection film and forming bonding pads are performed thereafter, these procedures are not described herein because they are known.

In Embodiment 2, the salicide technique is practiced with the impurity diffusion layers 207 of the memory transistors covered with the inter-gate insulating film 208, and therefore, no silicide layer is formed on the impurity diffusion layers 207. Accordingly, the impurity diffusion layers 107 adjacent to each other in the bit line direction are never short-circuited.

Also, the capacitor film 204b of the silicon nitride film not patterned is present below the upper silicon oxide film corresponding to the upper gate insulating film 204c, and therefore, even when the second insulating film 219 is excessively wet etched, there is no fear of exposure of the impurity diffusion layers 207 in the first active region 201.

Furthermore, the inter-gate insulating film 208 made of the first insulating film 218 is formed between the adjacent memory gate electrodes 205 in the first active region 201 at the same time as the sidewall insulating film 213 made of the first insulating film 218 on the side face of the logic gate electrode 212 in the second active region 202. Therefore, the number of procedures necessary for forming the sidewall insulating film 213 can be reduced.

Also, since the memory gate electrodes 205 and the logic gate electrode 212 are simultaneously formed, there is no need to provide an excessive margin in forming upper layer contacts above the memory gate electrodes 205 and the logic gate electrode 212, and hence, the semiconductor memory can be refined. In the case where an excessive margin is provided in forming the upper layer contacts, the memory gate electrodes 205 and the logic gate electrode 212 may be formed in different procedures.

Moreover, although each memory transistor formed in the first active region 201 is a memory device for trapping charge in the memory gate insulating film 204 in Embodiment 2, it may be a memory device for trapping charge in a floating gate electrode as in the modification of Embodiment 1.

What is claimed is:

1. A method for fabricating a semiconductor memory including a semiconductor substrate having a memory region and a logic region isolated from each other by an isolation insulating film, a plurality of memory transistors provided in the form of a matrix in said memory region of said semiconductor substrate and a logic transistor provided in said logic region, comprising the steps of:

forming, in said memory region, impurity diffusion layers working as source and drain regions of some memory transistors arranged along a bit line direction out of said plurality of memory transistors as a common impurity diffusion layer extending along the bit line direction;

forming a memory gate insulating film in said memory region and a logic gate insulating film in said logic region;

depositing a silicon-containing film on said memory gate insulating film and said logic gate insulating film;

patterning said silicon-containing film in said memory region, whereby forming gate electrodes of some memory transistors arranged along a word line direction out of said plurality of memory transistors as a common gate electrode extending along the word line direction, and patterning said silicon-containing film in said logic region, whereby forming a gate electrode of said logic transistor;

forming a sidewall insulating film on a side face of said gate electrode of said logic transistor;

forming, in said logic region, impurity diffusion layers working as source and drain regions of said logic transistor;

forming a first insulating film in said memory region and said logic region and forming a second insulating film directly on said first insulating film from a different material from said first insulating film;

successively etching said second insulating film and said first insulating film in said memory region, whereby exposing top faces of said gate electrodes of said plurality of memory transistors and whereby forming, from said first insulating film, an inter-gate insulating film having a top face at a level lower than a top face of said gate electrodes between adjacent gate electrodes of said plurality of memory transistors;

successively etching said second insulating film and said first insulating film in said logic region, whereby exposing top faces of said gate electrode and said impurity diffusion layers of said logic transistor; and forming a silicide layer on said gate electrodes of said plurality of memory transistors, on said gate electrode of said logic transistor and on portions of top faces, exposed from said sidewall insulating film, of said impurity diffusion layers of said logic transistor.

2. The method for fabricating a semiconductor memory of claim 1,
wherein said memory gate insulating film includes a capacitor film.

3. The method for fabricating a semiconductor memory of claim 2,
wherein said memory gate insulating film is composed of a multilayer structure including a lower silicon oxide film and an upper silicon nitride film, and
said capacitor film corresponds to said upper silicon nitride film.

4. The method for fabricating a semiconductor memory of claim 2,
wherein said memory gate insulating film is composed of a multilayer structure including a lower silicon oxide film, an intermediate silicon nitride film and an upper silicon oxide film, and
said capacitor film corresponds to said intermediate silicon nitride film.

5. The method for fabricating a semiconductor memory of claim 1,
wherein said silicon-containing film is simultaneously patterned in said memory region and in said logic region.

6. The method for fabricating a semiconductor memory of claim 1,
wherein a source region of one of a pair of memory transistors adjacent to each other along the bit line direction out of said plurality of memory transistors and a drain region of another of said adjacent memory transistors are formed as a common impurity diffusion layer.

7. A method for fabricating a semiconductor memory including a semiconductor substrate having a memory region and a logic region isolated from each other by an isolation insulating film, a plurality of memory transistors provided in the form of a matrix in said memory region and a logic transistor provided in said logic region, comprising the steps of:

forming, in said memory region, impurity diffusion layers working as source and drain regions of some memory transistors arranged along a bit line direction out of said plurality of memory transistors as a common impurity diffusion layer extending along the bit line direction;

forming a memory gate insulating film in said memory region and a logic gate insulating film in said logic region;

depositing a silicon-containing film on said memory gate insulating film and said logic gate insulating film;

patterning said silicon-containing film, whereby forming gate electrodes of some memory transistors arranged along a word line direction out of said plurality of memory transistors as a common gate electrode extending along the word line direction in said memory region, and whereby forming a gate electrode of said logic transistor in said logic region;

forming a first insulating film in said memory region and said logic region, and forming a second insulating film directly on said first insulating film from a different material from said first insulating film;

successively etching said second insulating film and said first insulating film in said memory region, whereby exposing top faces of said gate electrodes of said plurality of memory transistors and forming, from said first insulating film, an inter-gate insulating film having a top face at a level lower than top faces of gate electrodes between adjacent gate electrodes of said plurality of memory transistors;

successively etching said second insulating film and said first insulating film in said logic region, whereby exposing top faces of said gate electrode and said impurity diffusion layers of said logic transistor and forming, from said first insulating film, a sidewall insulating film on a side face of said gate electrode of said logic transistor;

forming impurity diffusion layers working as source and drain regions of said logic transistor in said logic region; and forming a silicide layer on said gate electrodes of said plurality of memory transistors, on said gate electrode of said logic transistor and on portions of top faces, exposed from said sidewall insulating film, of said impurity diffusion layers of said logic transistor.

8. The method for fabricating a semiconductor memory of claim 7,
wherein said memory gate insulating film is composed of a multilayer structure including a lower silicon oxide film, an intermediate silicon nitride film and an upper silicon oxide film, and
the step of forming a memory gate insulating film includes a sub-step of allowing said intermediate silicon nitride film to remain without being patterned.

9. The method for fabricating a semiconductor memory of claim 7,
wherein said memory gate insulating film is composed of a multilayer structure including a lower silicon oxide film, an intermediate silicon nitride film and an upper silicon oxide film, and
the step of successively etching said second insulating film and said first insulating film in said memory region includes a sub-step of allowing said intermediate silicon nitride film to remain.

10. The method for fabricating a semiconductor memory of claim 7,
wherein said silicon-containing film is patterned simultaneously in said memory region and said logic region.

11. The method for fabricating a semiconductor memory of claim 7,
wherein a source region of one of a pair of memory transistors adjacent to each other along the bit line direction out of said plurality of memory transistors and a drain region of another of said adjacent memory transistors are formed as a common impurity diffusion layer.

* * * * *